(12) United States Patent
Sakui et al.

(10) Patent No.: US 12,096,611 B2
(45) Date of Patent: Sep. 17, 2024

(54) SEMICONDUCTOR ELEMENT MEMORY DEVICE

(71) Applicant: Unisantis Electronics Singapore Pte. Ltd., Singapore (SG)

(72) Inventors: Koji Sakui, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 402 days.

(21) Appl. No.: 17/718,573

(22) Filed: Apr. 12, 2022

(65) Prior Publication Data

US 2022/0328488 A1    Oct. 13, 2022

(30) Foreign Application Priority Data

Apr. 13, 2021 (WO) .................. PCT/JP2021/015248

(51) Int. Cl.
*H01L 21/02* (2006.01)
*G11C 11/4097* (2006.01)
*H10B 12/00* (2023.01)

(52) U.S. Cl.
CPC .......... *H10B 12/20* (2023.02); *G11C 11/4097* (2013.01)

(58) Field of Classification Search
CPC ...... H10B 12/20; H10B 12/036; H10B 12/05; H10B 12/33; G11C 11/4097; G11C 11/4072; G11C 2211/4016; G11C 11/404
(Continued)

(56) References Cited

U.S. PATENT DOCUMENTS 10,777,564 B2 * 9/2020 Lin ................. G11C 16/14
12,016,172 B2 * 6/2024 Harada ............ G11C 11/40
(Continued)

FOREIGN PATENT DOCUMENTS

JP    H 02-188966 A    7/1990
JP    H 03-171768 A    7/1991
(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, vol. 38, No. 3, pp. 573-578 (1991).

(Continued)

*Primary Examiner* — Tan N Tran
(74) *Attorney, Agent, or Firm* — Crowell & Moring LLP

(57) ABSTRACT

A memory device includes a plurality of memory cells each including a semiconductor base material that stands on a substrate in a vertical direction or that extends in a horizontal direction along the substrate, voltages applied to a first gate conductor layer, a second gate conductor layer, a first impurity layer, and a second impurity layer in each of the memory cells are controlled to perform a memory write operation of retaining, inside a channel semiconductor layer, a group of positive holes generated by an impact ionization phenomenon or by a gate-induced drain leakage current, the voltages applied to the first gate conductor layer, the second gate conductor layer, the first impurity layer, and the second impurity layer are controlled to perform a memory erase operation of discharging the group of positive holes from inside the channel semiconductor layer, the first impurity layer is connected to a source line, the second impurity layer is connected to a bit line, one of the first gate conductor layer or the second gate conductor layer is connected to a word (Continued)

line, and the other of the first gate conductor layer or the second gate conductor layer is connected to a first driving control line, a voltage of the word line changes from a first voltage to a second voltage that is higher than the first voltage, and a voltage of the bit lines subsequently change from a third voltage to a fourth voltage that is higher than the third voltage to perform a memory read operation of reading to the bit lines, pieces of storage data in a plurality of semiconductor base materials selected by the word line.

9 Claims, 17 Drawing Sheets

(58) Field of Classification Search
USPC .......................................................... 257/295
See application file for complete search history.

(56) References Cited

U.S. PATENT DOCUMENTS

| | | |
|---|---|---|
| 2003/0111681 A1 | 6/2003 | Kawanaka |
| 2006/0049444 A1 | 3/2006 | Shino |
| 2008/0137394 A1 | 6/2008 | Shimano |
| 2008/0212366 A1 | 9/2008 | Ohsawa |

FOREIGN PATENT DOCUMENTS

| | | |
|---|---|---|
| JP | 2006-080280 A | 3/2006 |
| JP | 3957774 B2 | 8/2007 |
| JP | 2008-218556 A | 9/2008 |

OTHER PUBLICATIONS

H. Chung, H. Kim, H. Kim, K. Kim, S. Kim, K. Dong, J. Kim, Y. C. Oh, Y. Hwang, H. Hong, G. Jin, and C. Chung: "Novel 4F2 DRAM Cell with Vertical Pillar Transistor (VPT)," 2011 Proceeding of the European Solid-State Device Research Conference, (2011).
H. S. Philip Wong, S. Raoux, S. Kim, Jiale Liang, J. R. Reifenberg, B. Rajendran, M. Asheghi and K. E. Goodson: "Phase Change Memory," Proceeding of IEEE, vol. 98, No. 12, December, pp. 2201-2227 (2010).
T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3V," IEDM (2007).
W. Kang, L. Zhang, J. Klein, Y. Zhang, D. Ravelosona, and W. Zhao: "Reconfigurable Codesign of STT-MRAM Under Process Variations in Deeply Scaled Technoloy," IEEE Transaction on Electron Devices, pp. 1-9 (2015).

M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, vol. 31, No.5, pp. 405-407 (2010).
J. Wan, L. Rojer, A. Zaslavsky, and S. Critoloveanu: "A Compact Capacitor-Less High-Speed DRAM Using Field Effect-Controlled Charge Regeneration," Electron Device Letters, vol. 35, No. 2, pp. 179-181 (2012).
T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp. 1510-1522 (2002).
T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32mm Node and Beyond," IEEE IEDM (2006).
E. Yoshida and T. Tanaka: "A Design of a Capacitorless 1T-DRAM Cell Using Gate-induced Drain Leakage (GIDL) Current for Low-power and High-speed Embedded Memory," IEEE IEDM, pp. 913-916, Dec. 2003.
J. Y. Song, W. Y. Choi, J. H. Park, J. D. Lee, and B-G. Park: "Design Optimization of Gate-All-Around (GAA) MOSFETs," IEEE Trans. Electron Devices, vol. 5, No. 3, pp. 186-191, May 2006.
N. Loubet, et al.: "Stacked Nanosheet Gate-All-Around Transistor to Enable Scaling Beyond FinFET," 2017 IEEE Symposium on VLSI Technology Digest of Technical Papers, T17-5, T230-T231, Jun. 2017.
H. Jiang, N. Xu, B. Chen, L. Zeng1, Y. He, G. Du, X. Liu and X. Zhang: "Experimental investigation of self heating effect (SHE) in multiple-fin SOI FinFETs," Semicond. Sci. Technol. 29 (2014) 115021 (7 pp.).
E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697, Apr. 2006.
F. Morishita, H. Noda, I. Hayashi, T. Gyohten, M. Oksmoto, T. Ipposhi, S. Maegawa, K. Dosaka, and K. Arimoto: "A Capacitorless Twin-Transistor Random Access Memory (TTRAM) on SOI,"IEICE Trans. Electron, vol. E90-c., No. 4 pp. 765-771 (2007).
International Search Report (PCT/ISA/210) (Japanese) from PCT/JP2021/015248 dated Mar. 13, 2021, 3 pgs. See a translation identified as A26.
English translation of International Search of Search Report (PCT/ISA/210) of PCT/JP2021/015248, 2 pgs.
Written Opinion (PCT/ISA/237) (Japanese) of PCT/JP2021/015248 dated Jun. 22, 2021, 3 pgs.
F. Morishita, H. Noda, I. Hayashi, T. Gyohten, M. Okamoto, T. Ipposhi, S. Maegawa, K. Dosaka, and K. Arimoto: "A Capacitorless Twin-Transistor Random Access Memory (TTRAM) on SOI," IEICE Trans. Electron, vol. E90-c., No. 4 pp. 765-771 (2007) a brief description attached.

* cited by examiner

FIG. 3AA  "1" PAGE WRITE OPERATION
SOURCE-SIDE IMPACT IONIZATION
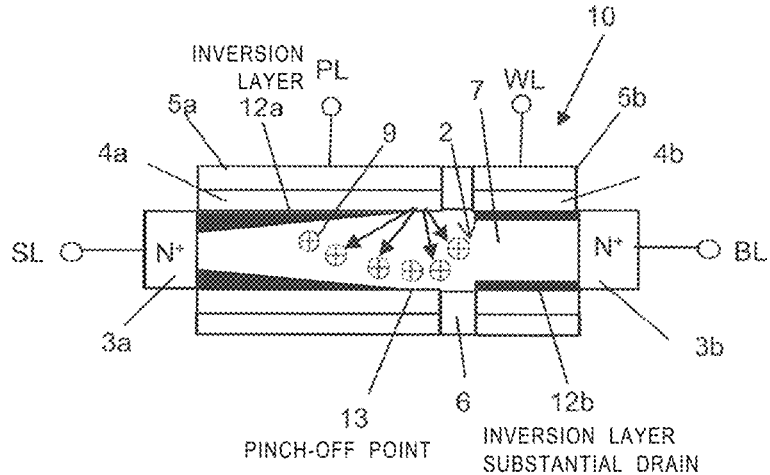
FIG. 3AB
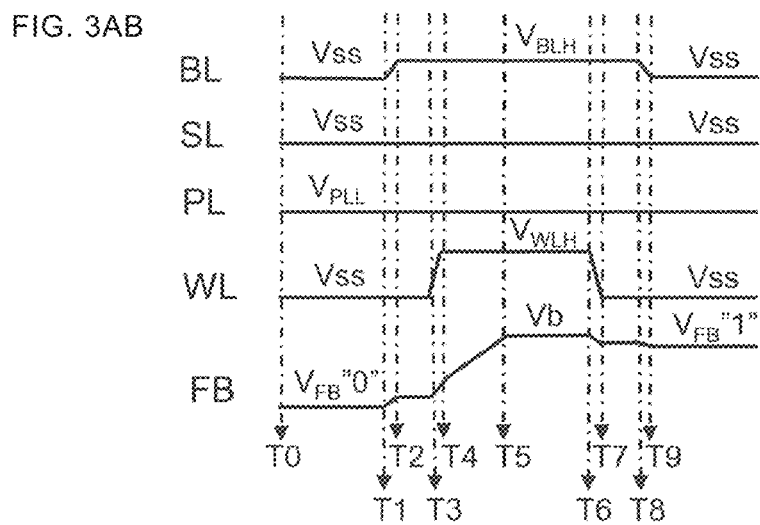
$$V_{FB}"1" = Vb - \underline{\beta_{WL} \times Vt_{WL}"1" - \beta_{BL} \times V_{BLH}} \quad (7)$$
$$\text{SMALL}$$
FIG. 3AC  "1" WRITE STATE
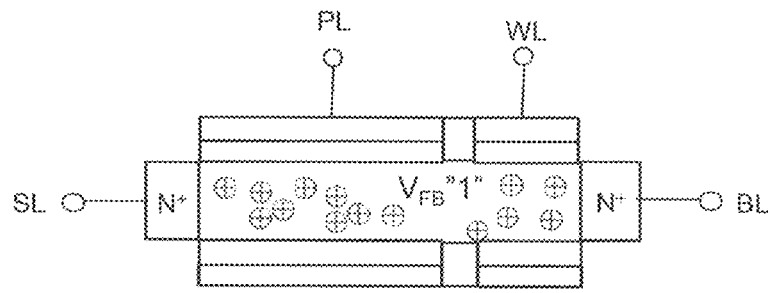

Page Erase

FIG. 4BA  "0" PAGE ERASE OPERATION TIMING CHART

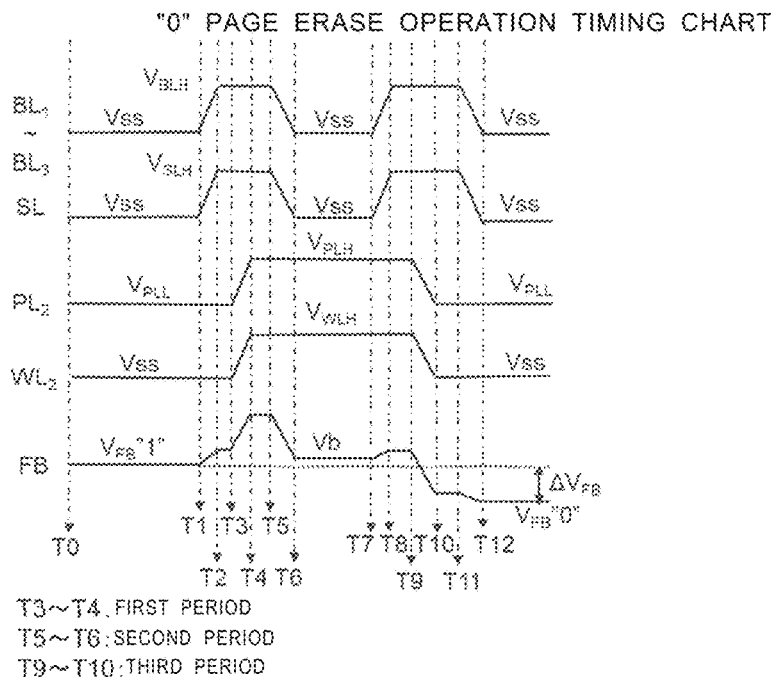

T3~T4: FIRST PERIOD
T5~T6: SECOND PERIOD
T9~T10: THIRD PERIOD

FIG. 4BB  "1" WRITE STATE (T0)

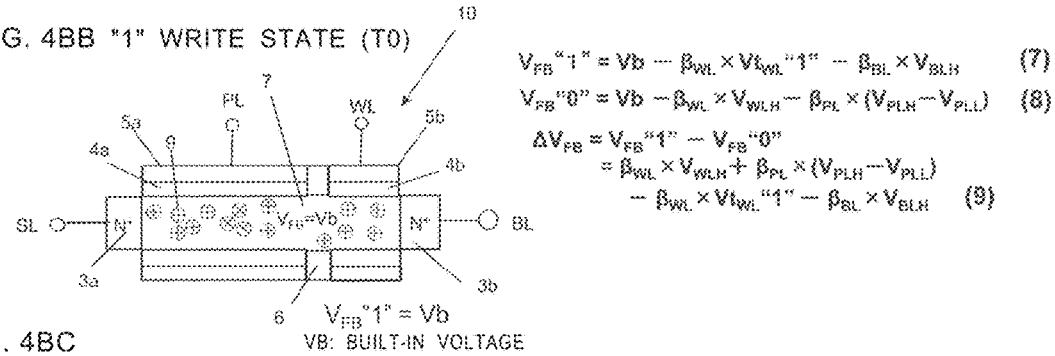

$$V_{FB}\text{"1"} = Vb - \beta_{WL} \times Vt_{WL}\text{"1"} - \beta_{BL} \times V_{BLH} \quad (7)$$

$$V_{FB}\text{"0"} = Vb - \beta_{WL} \times V_{WLH} - \beta_{PL} \times (V_{PLH} - V_{PLL}) \quad (8)$$

$$\Delta V_{FB} = V_{FB}\text{"1"} - V_{FB}\text{"0"}$$
$$= \beta_{WL} \times V_{WLH} + \beta_{PL} \times (V_{PLH} - V_{PLL})$$
$$- \beta_{WL} \times Vt_{WL}\text{"1"} - \beta_{BL} \times V_{BLH} \quad (9)$$

Vb: BUILT-IN VOLTAGE

FIG. 4BC
DISCHARGES GROUP OF POSITIVE HOLES 9 IN "0" ERASE OPERATION (T5 TO T6)

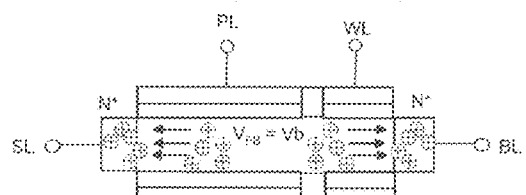

FIG. 4BD
WORD LINE WL AND PLATE LINE PL ARE CAPACITIVELY COUPLED WITH CHANNEL REGION 7 IN "0" ERASE OPERATION (T9 TO T10)

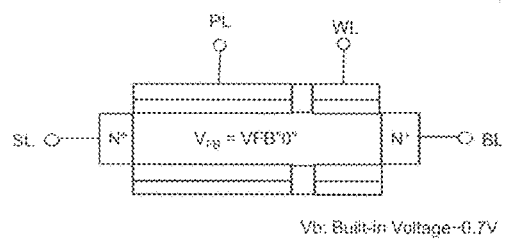

Vb: Built-in Voltage~0.7V

FIG. 4DA   "0" PAGE ERASE OPERATION TIMING CHART

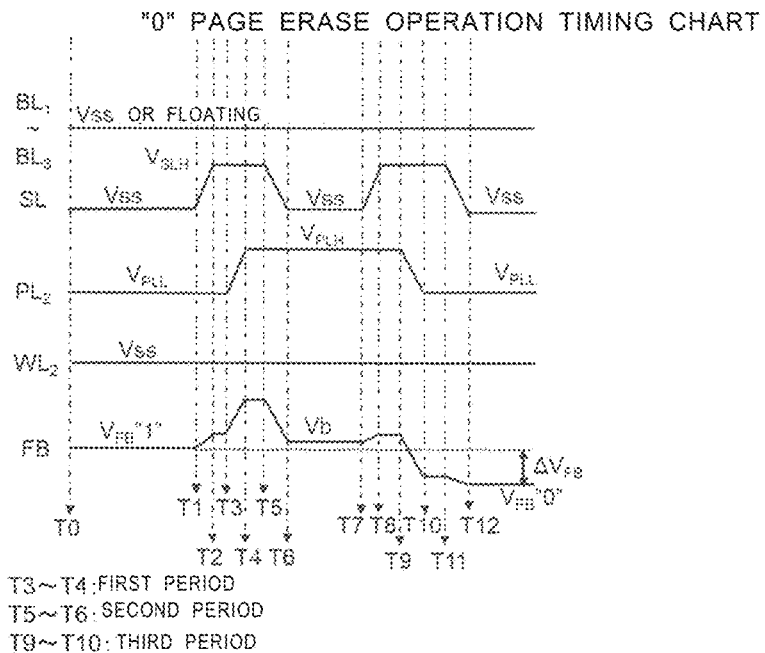

T3~T4: FIRST PERIOD
T5~T6: SECOND PERIOD
T9~T10: THIRD PERIOD

FIG. 4DB   "1" WRITE STATE (T0)

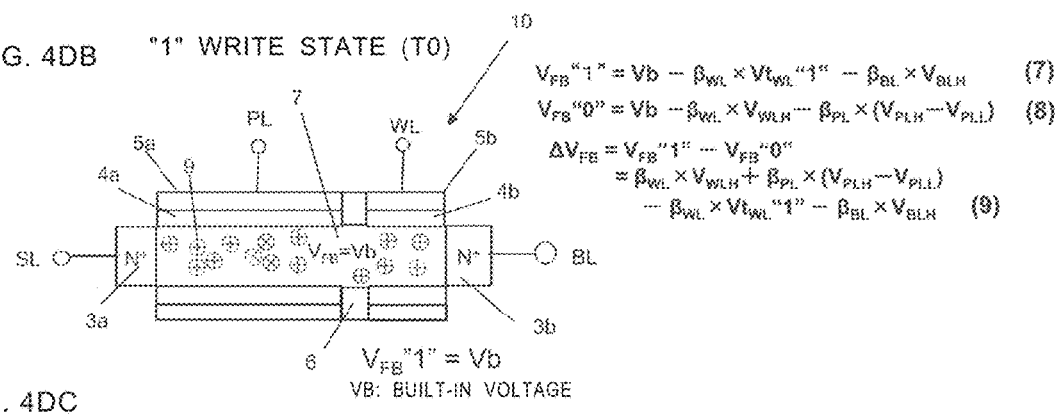

$V_{FB}"1" = Vb - \beta_{WL} \times Vt_{WL}"1" - \beta_{BL} \times V_{BLH}$ (7)

$V_{FB}"0" = Vb - \beta_{WL} \times V_{WLH} - \beta_{PL} \times (V_{PLH} - V_{PLL})$ (8)

$\Delta V_{FB} = V_{FB}"1" - V_{FB}"0"$
$= \beta_{WL} \times V_{WLH} + \beta_{PL} \times (V_{PLH} - V_{PLL})$
$- \beta_{WL} \times Vt_{WL}"1" - \beta_{BL} \times V_{BLH}$ (9)

VB: BUILT-IN VOLTAGE

FIG. 4DC
DISCHARGES GROUP OF POSITIVE HOLES 9 IN "0" ERASE OPERATION (T5 TO T6)

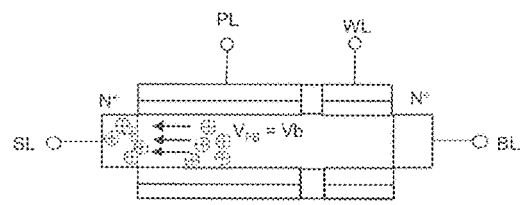

FIG. 4DD
WORD LINE WL AND PLATE LINE PL ARE CAPACITIVELY COUPLED WITH CHANNEL REGION 7 IN "0" ERASE OPERATION (T9 TO T10)

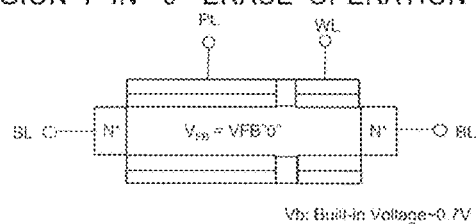

Vb: Built-in Voltage~0.7V

FIG. 4EA    "0" PAGE ERASE OPERATION TIMING CHART

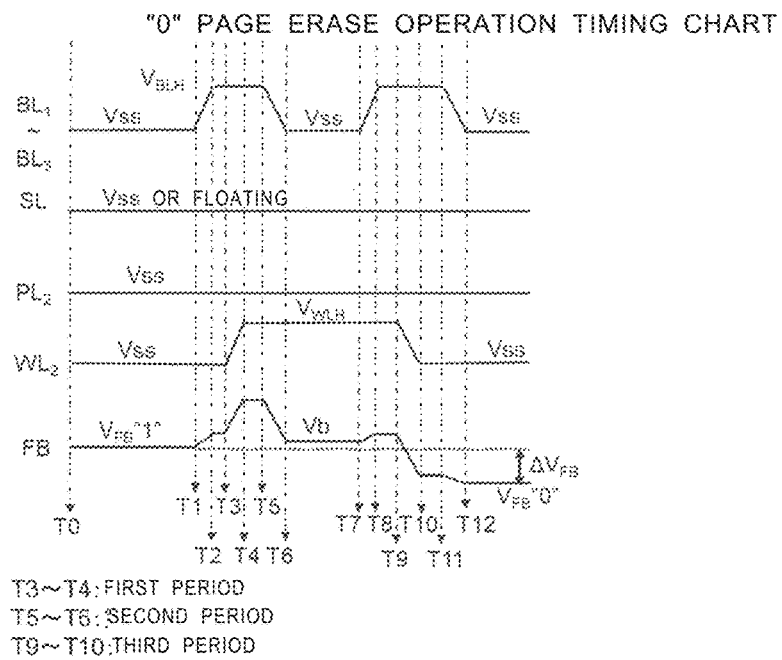

T3~T4: FIRST PERIOD
T5~T6: SECOND PERIOD
T9~T10: THIRD PERIOD

FIG. 4EB  "1" WRITE STATE (T0)

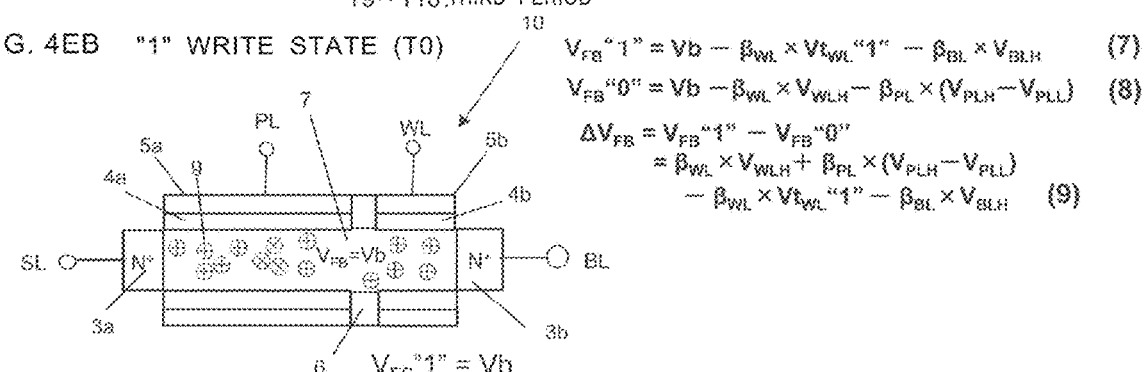

$$V_{FB}"1" = Vb - \beta_{WL} \times Vt_{WL}"1" - \beta_{BL} \times V_{BLH} \quad (7)$$

$$V_{FB}"0" = Vb - \beta_{WL} \times V_{WLH} - \beta_{PL} \times (V_{PLH} - V_{PLL}) \quad (8)$$

$$\Delta V_{FB} = V_{FB}"1" - V_{FB}"0"$$
$$= \beta_{WL} \times V_{WLH} + \beta_{PL} \times (V_{PLH} - V_{PLL})$$
$$- \beta_{WL} \times Vt_{WL}"1" - \beta_{BL} \times V_{BLH} \quad (9)$$

FIG. 4EC  DISCHARGES GROUP OF POSITIVE HOLES 9 IN "0" ERASE OPERATION (T5 TO T6)

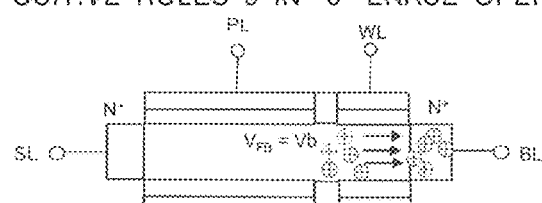

FIG. 4ED  WORD LINE WL AND PLATE LINE PL ARE CAPACITIVELY COUPLED WITH CHANNEL REGION 7 IN "0" ERASE OPERATION (T9 TO T10)

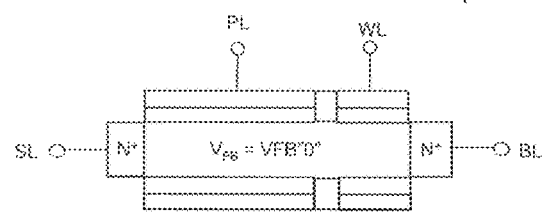

Vb: Built-in Voltage~0.7V

FIG. 5A "1" WRITE STATE
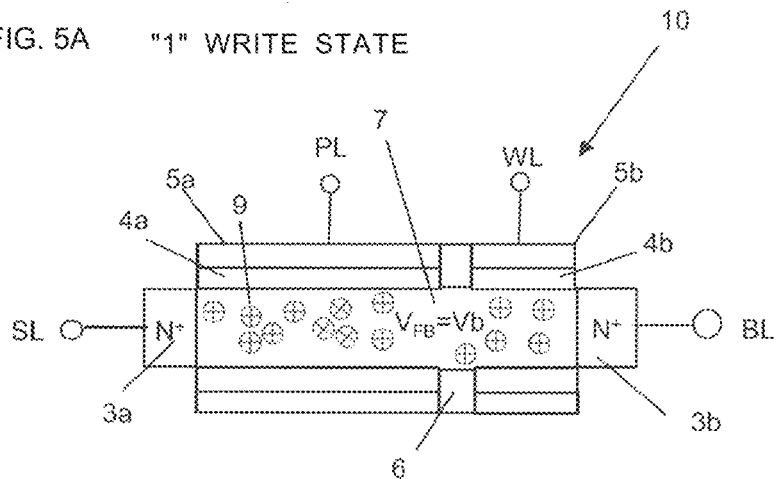
FIG. 5B "0" ERASE STATE
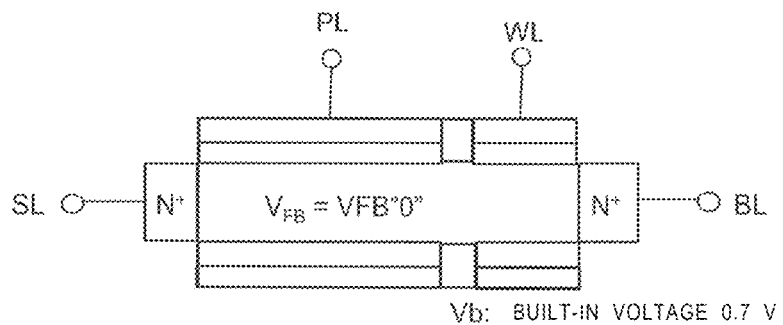
Vb: BUILT-IN VOLTAGE 0.7 V
FIG. 5C   CELL CURRENT
Icell (BL to SL Current)
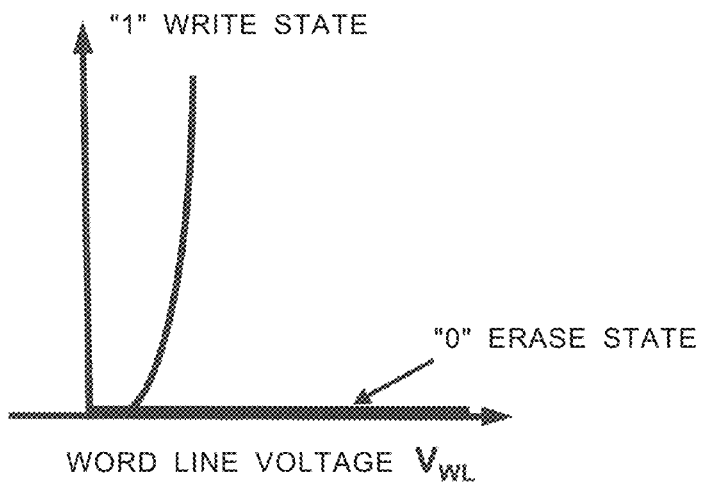

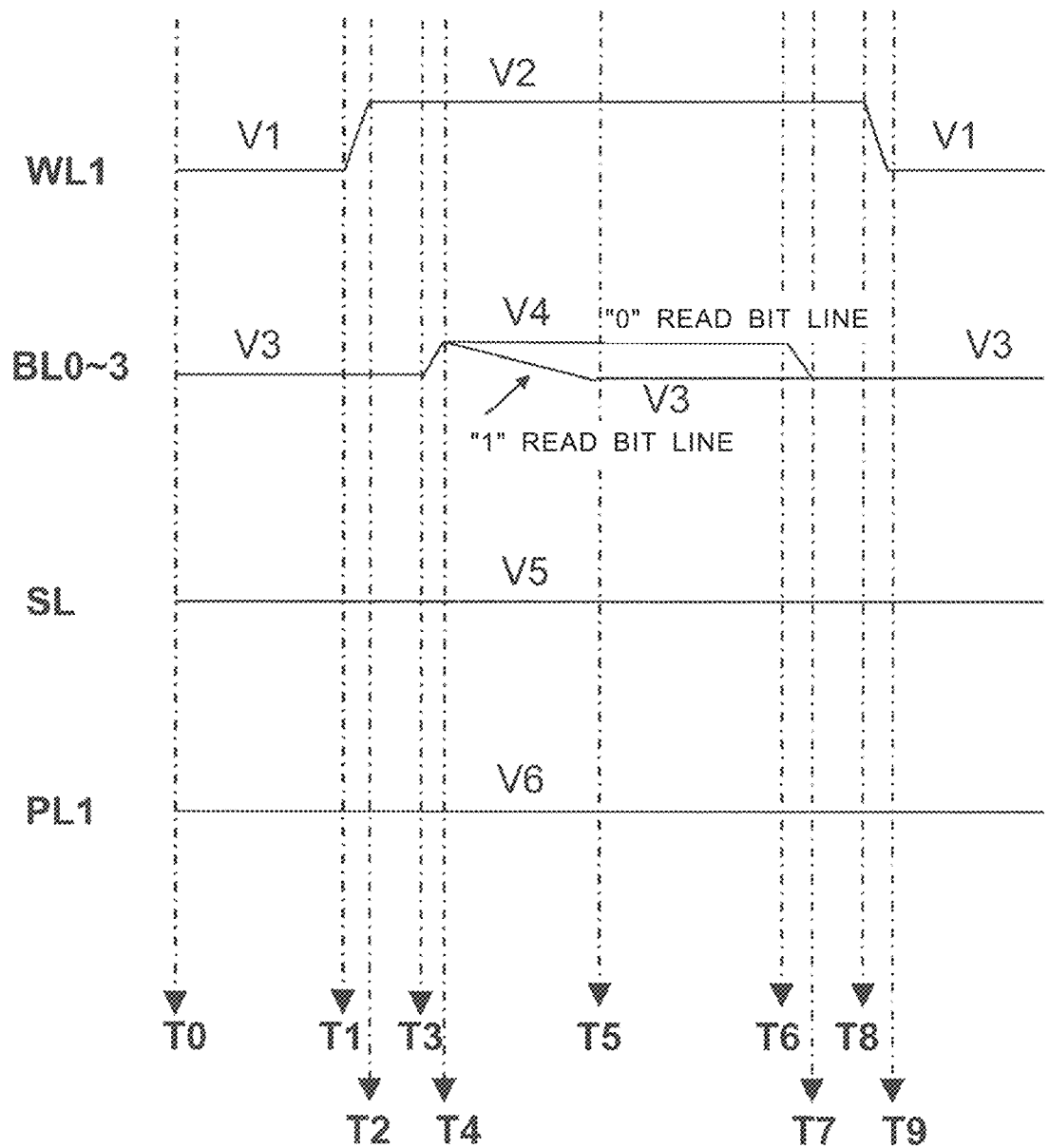

$$V_{FB}\text{"1"} \Rightarrow V_{FB}\text{"1"} - V\alpha$$

FIG. 6DA
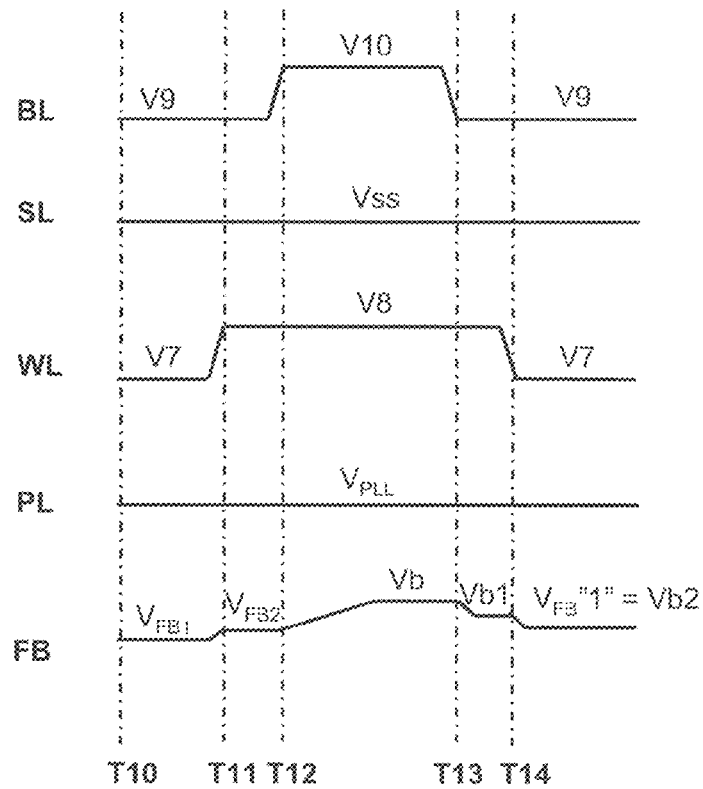
$$\beta_{WL} = \frac{C_{WL}}{C_{WL} + C_{PL} + C_{BL} + C_{SL}} \quad (2)$$
$$V_{FB2} = V_{FB1} + \beta_{WL} \times (V8-V7) \quad (10)$$
$$Vb1 = Vb - \beta_{BL} \times (V10-V9) \quad (11)$$
$$V_{FB}\text{"1"} = Vb2 = Vb1 - \beta_{WL} \times (V8-V7)$$
$$= Vb - \beta_{BL} \times (V10-V9) - \beta_{WL} \times (V8-V7) \quad (12)$$
FIG. 6DB    CELL CURRENT
Icell (BL to SL Current)
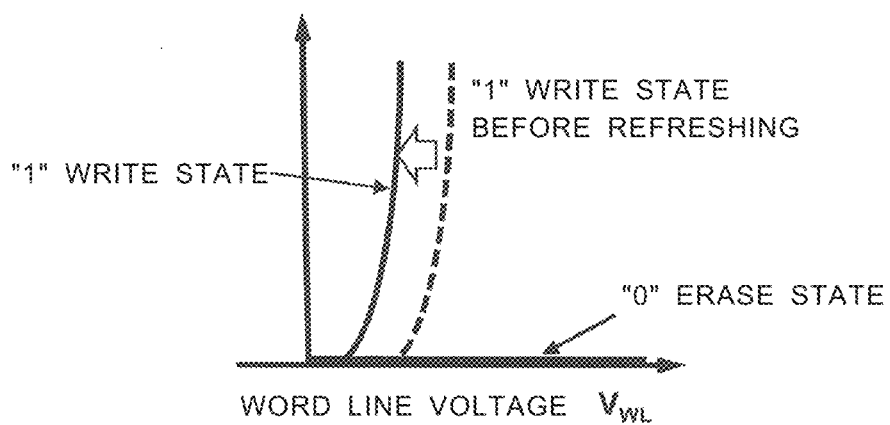

$$C_{FB} = C_{WL} + C_{BL} + C_{SL} \quad (13)$$

$$\beta_{WL} = \frac{C_{WL}}{C_{WL} + C_{BL} + C_{SL}} \quad (14)$$

$$\Delta V_{FB} = V_{FB2} - V_{FB1}$$
$$= \beta_{WL} \times V_{WLH} \quad (15)$$

SEMICONDUCTOR ELEMENT MEMORY DEVICE

CROSS-REFERENCE TO RELATED APPLICATIONS

This application claims priority to PCT/JP2021/015248 filed Apr. 13, 2021, the enter content of which is incorporated herein by reference.

TECHNICAL FIELD

The present invention relates to a semiconductor memory device including a semiconductor element.

BACKGROUND ART

Recently, there has been a demand for highly integrated and high-performance memory elements in the development of LSI (Large Scale Integration) technology.

Typical planar MOS transistors include a channel that extends in a horizontal direction along the upper surface of the semiconductor substrate. In contrast, SGTs include a channel that extends in a direction perpendicular to the upper surface of the semiconductor substrate (see, for example, PTL 1 and NPL 1). Accordingly, the density of semiconductor devices can be made higher with SGTs than with planar MOS transistors. Such SGTs can be used as selection transistors to implement highly integrated memories, such as a DRAM (Dynamic Random Access Memory, see, for example, NPL 2) to which a capacitor is connected, a PCM (Phase Change Memory, see, for example, NPL 3) to which a resistance change element is connected, an RRAM (Resistive Random Access Memory, see, for example, NPL 4), and an MRAM (Magneto-resistive Random Access Memory, see, for example, NPL 5) that changes the resistance by changing the orientation of a magnetic spin with a current. Further, there exists, for example, a DRAM memory cell (see, for example, NPL 6) constituted by a single MOS transistor and including no capacitor. The present application relates to a dynamic flash memory that can be constituted only by a MOS transistor and that includes no resistance change element or capacitor.

FIGS. 7A to 7D illustrate a write operation of a DRAM memory cell constituted by a single MOS transistor and including no capacitor described above, FIGS. 8A and 8B illustrate a problem in the operation, and FIGS. 9A to 9C illustrate a read operation (see NPL 7 to NPL 10). FIG. 7A illustrates a "1" write state. Here, the memory cell is formed on an SOI substrate 100, is constituted by a source $N^+$ layer 103 (hereinafter, a semiconductor region that contains a donor impurity in high concentrations is referred to as "$N^+$ layer") to which a source line SL is connected, a drain $N^+$ layer 104 to which a bit line BL is connected, a gate conductor layer 105 to which a word line WL is connected, and a floating body 102 of a MOS transistor 110, and includes no capacitor. The single MOS transistor 110 constitutes the DRAM memory cell. Directly under the floating body 102, a $SiO_2$ layer 101 of the SOI substrate is in contact with the floating body 102. To write "1" to the memory cell constituted by the single MOS transistor 110, the MOS transistor 110 is operated in the saturation region. That is, a channel 107, for electrons, extending from the source $N^+$ layer 103 has a pinch-off point 108 and does not reach the drain $N^+$ layer 104 to which the bit line is connected. When a high voltage is applied to both the bit line BL connected to the drain $N^+$ layer and the word line WL connected to the gate conductor layer 105, and the MOS transistor 110 is operated at the gate voltage that is about one-half of the drain voltage, the electric field intensity becomes maximum at the pinch-off point 108 that is in the vicinity of the drain $N^+$ layer 104. As a result, accelerated electrons that flow from the source $N^+$ layer 103 toward the drain $N^+$ layer 104 collide with the Si lattice, and with kinetic energy lost at the time of collision, electron-positive hole pairs are generated (impact ionization phenomenon). Most of the generated electrons (not illustrated) reach the drain $N^+$ layer 104. Further, a very small proportion of the electrons that are very hot jump over a gate oxide film 109 and reach the gate conductor layer 105. Simultaneously, positive holes 106 are generated with which the floating body 102 is charged. In this case, the generated positive holes contribute to an increase in the majority carriers because the floating body 102 is P-type Si. When the floating body 102 is filled with the generated positive holes 106 and the voltage of the floating body 102 becomes higher than that of the source $N^+$ layer 103 by Vb or more, further generated positive holes are discharged to the source $N^+$ layer 103. Here, Vb is the built-in voltage of the PN junction between the source $N^+$ layer 103 and the P layer, namely, the floating body 102, and is equal to about 0.7 V. FIG. 7B illustrates a state in which the floating body 102 is charged to saturation with the generated positive holes 106.

Now, a "0" write operation of the memory cell 110 will be described with reference to FIG. 7C. For the common selection word line WL, the memory cell 110 to which "1" is written and the memory cell 110 to which "0" is written are present at random. FIG. 7C illustrates a state of rewriting from the "1" write state to a "0" write state. To write "0", the voltage of the bit line BL is set to a negative bias, and the PN junction between the drain $N^+$ layer 104 and the P layer, namely, the floating body 102, is forward biased. As a result, the positive holes 106 in the floating body 102 generated in advance in the previous cycle flow into the drain $N^+$ layer 104 that is connected to the bit line BL. When the write operation ends, the two memory cells are in a state in which the memory cell 110 (FIG. 7B) is filled with the generated positive holes 106, and from the memory cell 110 (FIG. 7C), the generated positive holes are discharged. The potential of the floating body 102 of the memory cell 110 filled with the positive holes 106 becomes higher than that of the floating body 102 in which generated positive holes are not present. Therefore, the threshold voltage for the memory cell 110 to which "1" is written becomes lower than the threshold voltage for the memory cell 110 to which "0" is written. This is illustrated in FIG. 7D.

Now, a problem in the operation of the memory cell constituted by the single MOS transistor 110 will be described with reference to FIGS. 8A and 8B. As illustrated in FIG. 8A, the capacitance $C_{FB}$ of the floating body is equal to the sum of the capacitance $C_{WL}$ between the gate to which the word line is connected and the floating body, the junction capacitance $C_{SL}$ of the PN junction between the source $N^+$ layer 103 to which the source line is connected and the floating body 102, and the junction capacitance $C_{BL}$ of the PN junction between the drain $N^+$ layer 104 to which the bit line is connected and the floating body 102 and is expressed as follows.

$$C_{FB}=C_{WL}+C_{BL}+C_{SL} \quad (13)$$

The capacitive coupling ratio $\beta_{WL}$ between the gate to which the word line is connected and the floating body is expressed as follows.

$$\beta_{WL}=C_{WL}/(C_{WL}+C_{BL}+C_{SL}) \quad (14)$$

Therefore, a change in the word line voltage $V_{WL}$ at the time of reading or writing affects the voltage of the floating body 102 that functions as a storage node (contact point) of the memory cell. This is illustrated in FIG. 8B. When the word line voltage $V_{WL}$ rises from 0 V to $V_{WLH}$ at the time of reading or writing, the voltage $V_{FB}$ of the floating body 102 rises from $V_{FB1}$, which is the voltage in the initial state before the word line voltage changes, to $V_{FB2}$ due to capacitive coupling with the word line. The voltage change amount $\Delta V_{FB}$ is expressed as follows.

$$\Delta V_{FB} = V_{FB2} - V_{FB1} = \beta_{WL} \times V_{WLH} \qquad (15)$$

Here, for $\beta_{WL}$ in expression (14), contribution of $C_{WL}$ is large and, for example, $C_{WL}:C_{BL}:C_{SL}=8:1:1$ holds. This results in $\beta_{WL}=0.8$. When the word line changes, for example, from 5 V at the time of writing to 0 V after the end of writing, the floating body 102 receives an amplitude noise of 5 V×$\beta_{WL}$=4 V due to capacitive coupling between the word line WL and the floating body 102. Accordingly, a sufficient margin is not provided to the potential difference between the "1" potential and the "0" potential of the floating body 102 at the time of writing, which is a problem.

FIGS. 9A to 9C illustrate a read operation where FIG. 9A illustrates a "1" write state and FIG. 9B illustrates a "0" write state. In actuality, however, even when Vb is set for the floating body 102 to write "1", once the word line returns to 0 V at the end of writing, the floating body 102 is lowered to a negative bias. When "0" is written, the floating body 102 is lowered to a further negative bias, and it is difficult to provide a sufficiently large margin to the potential difference between "1" and "0" at the time of writing as illustrated in FIG. 9C. Therefore, there has been difficulty in commercially introducing DRAM memory cells actually including no capacitor.

CITATION LIST

Patent Literature

[PTL 1] Japanese Unexamined Patent Application Publication No. 2-188966
[PTL 2] Japanese Unexamined Patent Application Publication No. 3-171768
[PTL 3] Japanese Patent No. 3957774

Non Patent Literature

[NPL 1] Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)
[NPL 2] H. Chung, H. Kim, H. Kim, K. Kim, S. Kim, K. Dong, J. Kim, Y. C. Oh, Y. Hwang, H. Hong, G. Jin, and C. Chung: "4F2 DRAM Cell with Vertical Pillar Transistor (VPT)", 2011 Proceeding of the European Solid-State Device Research Conference, (2011)
[NPL 3] H. S. Philip Wong, S. Raoux, S. Kim, Jiale Liang, J. R. Reifenberg, B. Rajendran, M. Asheghi and K. E. Goodson: "Phase Change Memory", Proceeding of IEEE, Vol. 98, No. 12, December, pp. 2201-2227 (2010)
[NPL 4] T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3V", IEDM (2007)
[NPL 5] W. Kang, L. Zhang, J. Klein, Y. Zhang, D. Ravelosona, and W. Zhao: "Reconfigurable Codesign of STT-MRAM Under Process Variations in Deeply Scaled Technology", IEEE Transaction on Electron Devices, pp. 1-9 (2015)
[NPL 6] M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron", IEEE Electron Device Letter, Vol. 31, No. 5, pp. 405-407 (2010)
[NPL 7] J. Wan, L. Rojer, A. Zaslaysky, and S. Critoloveanu: "A Compact Capacitor-Less High-Speed DRAM Using Field Effect-Controlled Charge Regeneration", Electron Device Letters, Vol. 35, No. 2, pp. 179-181 (2012)
[NPL 8] T. Ohsawa, K. Fujita, T. Higashi, Y. Iwata, T. Kajiyama, Y. Asao, and K. Sunouchi: "Memory design using a one-transistor gain cell on SOI", IEEE JSSC, vol. 37, No. 11, pp. 1510-1522 (2002).
[NPL 9] T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond", IEEE IEDM (2006).
[NPL 10] E. Yoshida: "A Capacitorless 1T-DRAM Technology Using Gate-Induced Drain-Leakage (GIDL) Current for Low-Power and High-Speed Embedded Memory", IEEE IEDM (2006).
[NPL 11] J. Y. Song, W. Y. Choi, J. H. Park, J. D. Lee, and B-G. Park: "Design Optimization of Gate-All-Around (GAA) MOSFETs", IEEE Trans. Electron Devices, vol. 5, no. 3, pp. 186-191, May 2006.
[NPL 12] N. Loubet, et al.: "Stacked Nanosheet Gate-All-Around Transistor to Enable Scaling Beyond FinFET", 2017 IEEE Symposium on VLSI Technology Digest of Technical Papers, T17-5, T230-T231, June 2017.
[NPL 13] H. Jiang, N. Xu, B. Chen, L. Zengl, Y. He, G. Du, X. Liu and X. Zhang: "Experimental investigation of self heating effect (SHE) in multiple-fin SOI FinFETs", Semicond. Sci. Technol. 29 (2014) 115021 (7pp).
[NPL 14] E. Yoshida, and T. Tanaka: "A Capacitorless 1T-DRAM Technology Using Gate-Induced Drain-Leakage (GIDL) Current for Low-Power and High-Speed Embedded Memory", IEEE Transactions on Electron Devices, Vol. 53, No. 4, pp. 692-697, April 2006.

SUMMARY OF INVENTION

Technical Problem

In capacitor-less single-transistor DRAMs (gain cells), capacitive coupling between the word line and the floating body is strong. When the potential of the word line is changed at the time of data reading or at the time of data writing, the change is transmitted as direct noise to the floating body, which is a problem. This causes a problem of erroneous reading or erroneous rewriting of storage data and makes it difficult to commercially introduce capacitor-less single-transistor DRAMs (gain cells).

Solution to Problem

To solve the above-described problem, a semiconductor element memory device according to the present invention includes a block that includes a plurality of memory cells arranged in a matrix,
each of the memory cells including:
a semiconductor base material that stands on a substrate in a vertical direction or that extends in a horizontal direction along the substrate;
a first impurity layer and a second impurity layer that are disposed at respective ends of the semiconductor base material;
a first gate insulating layer that partially or entirely surrounds a side surface of the semiconductor base material between the first impurity layer and the second impurity layer and that is in contact with or in close vicinity to the first impurity layer;
a second gate insulating layer that partially or entirely surrounds the side surface of the semiconductor base material, that is connected to the first gate insulating layer, and that is in contact with or in close vicinity to the second impurity layer;
a first gate conductor layer that partially or entirely covers the first gate insulating layer;
a second gate conductor layer that covers the second gate insulating layer; and
a channel semiconductor layer that is a part of the semiconductor base material and that is covered by the first gate insulating layer and the second gate insulating layer, in which
in each of the memory cells,
voltages applied to the first gate conductor layer, the second gate conductor layer, the first impurity layer, and the second impurity layer are controlled to perform a write operation and an erase operation,
the first impurity layer of each of the memory cells is connected to a source line, the second impurity layer of each of the memory cells is connected to a bit line, one of the first gate conductor layer or the second gate conductor layer of each of the memory cells is connected to a word line, and the other of the first gate conductor layer or the second gate conductor layer of each of the memory cells is connected to a first driving control line, and
a voltage of the word line changes from a first voltage to a second voltage that is higher than the first voltage, and a voltage of the bit lines subsequently change from a third voltage to a fourth voltage that is higher than the third voltage to perform a memory read operation of reading to the bit lines, pieces of storage data in a plurality of memory cells selected by the word line (first invention).

In the first invention described above, in a reset operation subsequent to the memory read operation, the voltage of the bit lines changes from the fourth voltage to the third voltage, and the voltage of the word line subsequently changes from the second voltage to the first voltage (second invention).

In the first invention described above, the source line is kept at a fifth voltage during the memory read operation and during a reset operation (third invention).

In the third invention described above, the first driving control line is kept at a sixth voltage during the memory read operation and during the reset operation (fourth invention).

In the fourth invention described above, the sixth voltage is higher than the fifth voltage (fifth invention).

In the first invention described above, a voltage of the channel semiconductor layer is equal to a first data retention voltage at a first time, the voltage of the word line changes from a seventh voltage to an eighth voltage that is higher than the first voltage at a second time after an elapse of time from the first time, and the voltage of the bit line subsequently changes from a ninth voltage to a tenth voltage that is higher than the third voltage to perform a refresh operation for the semiconductor base material in which the voltage of the channel semiconductor layer has been equal to the first data retention voltage, and the voltage of the channel semiconductor layer is restored to a voltage close to the first data retention voltage (sixth invention).

In the first invention described above, a first gate capacitance between the first gate conductor layer and the channel semiconductor layer is made larger than a second gate capacitance between the second gate conductor layer and the channel semiconductor layer (seventh invention).

In the first invention described above, in the write operation, a group of positive holes generated by an impact ionization phenomenon are retained inside the channel semiconductor layer, and a voltage of the channel semiconductor layer is made equal to a first data retention voltage that is higher than the voltage of either the first impurity layer or the second impurity layer or that is higher than the voltages of both the first impurity layer and the second impurity layer, and in the erase operation, the voltages applied to the first impurity layer, the second impurity layer, the first gate conductor layer, and the second gate conductor layer are controlled to discharge the group of positive holes through either the first impurity layer or the second impurity layer or both the first impurity layer and the second impurity layer, and the voltage of the channel semiconductor layer is made equal to a second data retention voltage that is lower than the first data retention voltage (ninth invention).

In the first invention described above, the first gate conductor layer is isolated into two conductor layers around the first gate insulating layer in plan view (eighth invention).

BRIEF DESCRIPTION OF DRAWINGS

FIGS. 3AA, 3AB and 3AC include diagrams for explaining a mechanism of a write operation of the memory device including an SGT according to the first embodiment.

FIGS. 4BA, 4BB, 4BC and 4BD include diagrams for explaining the mechanism of the page erase operation of the memory device including an SGT according to the first embodiment.

FIGS. 4DA, 4DB, 4DC and 4DD include diagrams for explaining a mechanism of the page erase operation of the memory device including an SGT according to the first embodiment.

FIGS. 4EA, 4EB, 4EC and 4ED include diagrams for explaining a mechanism of the page erase operation of the memory device including an SGT according to the first embodiment.

FIGS. 5A, 5B and 5C include diagrams for explaining a mechanism of a read operation of the memory device including an SGT according to the first embodiment.

FIG. 6B is an operation waveform diagram for explaining the memory read operation of the memory device including an SGT according to the first embodiment.

FIGS. 6DA and 6DB include diagrams for explaining the refresh operation of the memory device including an SGT according to the first embodiment.

DESCRIPTION OF EMBODIMENTS

Hereinafter, embodiments of a memory device (hereinafter called a dynamic flash memory) including a semiconductor element according to the present invention will be described with reference to the drawings.

First Embodiment

The structure and operation mechanisms of a dynamic flash memory cell according to a first embodiment of the present invention will be described with reference to FIG. 1 to FIGS. 5A-5C. The structure of the dynamic flash memory cell will be described with reference to FIG. 1. An effect attained in a case where the gate capacitance of a first gate conductor layer 5a connected to a plate line PL is made larger than the gate capacitance of a second gate conductor layer 5b to which a word line WL is connected will be described with reference to FIGS. 2A-2C. A mechanism of a data write operation will be described with reference to FIGS. 3AA-3AC and FIG. 3B, mechanisms of a data erase operation will be described with reference to FIG. 4A to FIGS. 4EA-4ED, and a mechanism of a data read operation will be described with reference to FIGS. 5A-5C.

Figure 1:
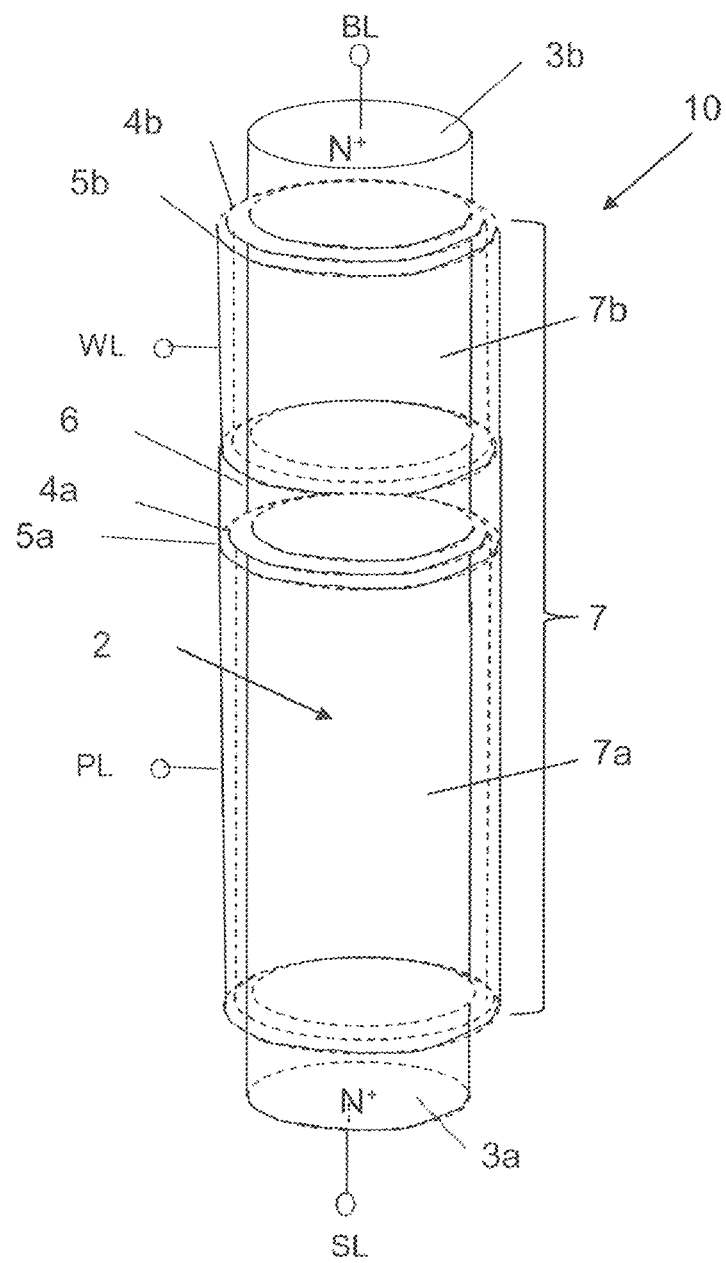
FIG. 1 is a structural diagram of a memory device including an SGT according to a first embodiment.

FIG. 1 illustrates the structure of the dynamic flash memory cell according to the first embodiment of the present invention. On the top and the bottom of a silicon semiconductor pillar 2 (hereinafter, the silicon semiconductor pillar is referred to as "Si pillar") (which is an example of "semiconductor base material" in the claims) of the P or i (intrinsic) conductivity type formed on a substrate, N+ layers 3a and 3b (which are examples of "first impurity layer" and "second impurity layer" in the claims), one of which functions as the source and the other functions as the drain, are formed respectively. The part of the Si pillar 2 between the N+ layers 3a and 3b that function as the source and the drain functions as a channel region 7 (which is an example of "channel semiconductor layer" in the claims).

Around the channel region 7, a first gate insulating layer 4a (which is an example of "first gate insulating layer" in the claims) and a second gate insulating layer 4b (which is an example of "second gate insulating layer" in the claims) are formed. The first gate insulating layer 4a and the second gate insulating layer 4b are in contact with or in close vicinity to the N+ layers 3a and 3b that function as the source and the drain respectively. Around the first gate insulating layer 4a and the second gate insulating layer 4b, the first gate conductor layer 5a (which is an example of "first gate conductor layer" in the claims) and the second gate conductor layer 5b (which is an example of "second gate conductor layer" in the claims) are formed respectively. The first gate conductor layer 5a and the second gate conductor layer 5b are isolated from each other by an insulating layer 6 (which is also referred to as "first insulating layer"). The channel region 7 between the N+ layers 3a and 3b is constituted by a first channel Si layer 7a (which is also referred to as "first channel semiconductor layer") surrounded by the first gate insulating layer 4a and a second channel Si layer 7b (which is also referred to as "second channel semiconductor layer") surrounded by the second gate insulating layer 4b. Accordingly, the N+ layers 3a and 3b that function as the source and the drain, the channel region 7, the first gate insulating layer 4a, the second gate insulating layer 4b, the first gate conductor layer 5a, and the second gate conductor layer 5b constitute a dynamic flash memory cell 10. The N+ layer 3a that functions as the source is connected to a source line SL (which is an example of "source line" in the claims), the N+ layer 3b that functions as the drain is connected to a bit line BL (which is an example of "bit line" in the claims), the first gate conductor layer 5a is connected to the plate line PL (which is an example of "first driving control line" in the claims), and the second gate conductor layer 5b is connected to the word line WL (which is an example of "word line" in the claims). Desirably, the structure is such that the gate capacitance of the first gate conductor layer 5a to which the plate line PL is connected is larger than the gate capacitance of the second gate conductor layer 5b to which the word line WL is connected.

In FIG. 1, to make the gate capacitance of the first gate conductor layer 5a connected to the plate line PL larger than the gate capacitance of the second gate conductor layer 5b to which the word line WL is connected, the gate length of the first gate conductor layer 5a is made longer than the gate length of the second gate conductor layer 5b. Alternatively, instead of making the gate length of the first gate conductor layer 5a longer than the gate length of the second gate conductor layer 5b, the thicknesses of the respective gate insulating layers may be made different such that the thickness of the gate insulating film of the first gate insulating layer 4a is thinner than the thickness of the gate insulating film of the second gate insulating layer 4b. Alternatively, the dielectric constants of the materials of the respective gate insulating layers may be made different such that the dielectric constant of the gate insulating film of the first gate insulating layer 4a is higher than the dielectric constant of the gate insulating film of the second gate insulating layer 4b. The gate capacitance of the first gate conductor layer 5a connected to the plate line PL may be made larger than the gate capacitance of the second gate conductor layer 5b to which the word line WL is connected, by a combination of any of the lengths of the gate conductor layers 5a and 5b and the thicknesses and dielectric constants of the gate insulating layers 4a and 4b.

Figure 2A:
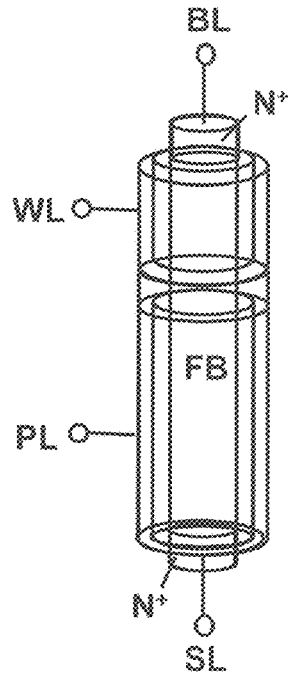
FIGS. 2A, 2B and 2C include diagrams for explaining an effect attained in a case where the gate capacitance of a first gate conductor layer 5a connected to a plate line PL is made larger than the gate capacitance of a second gate conductor layer 5b to which a word line WL is connected in the memory device including an SGT according to the first embodiment.
Figure 2B:
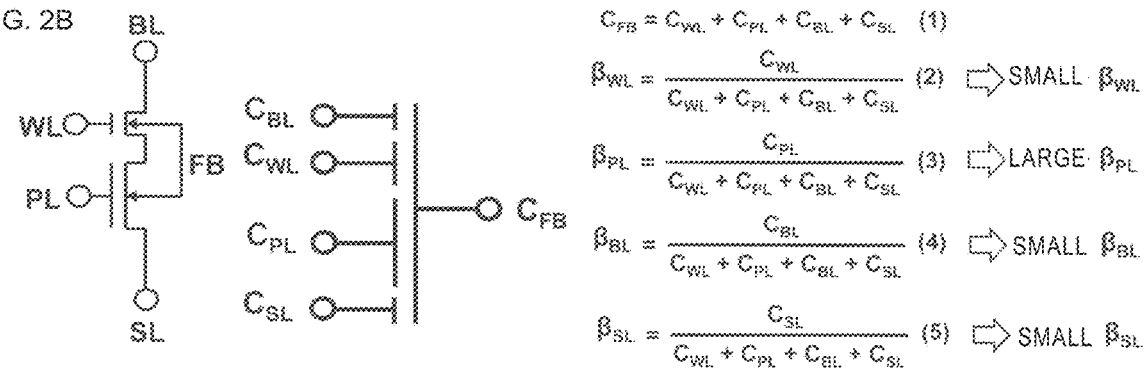
Figure 2C:
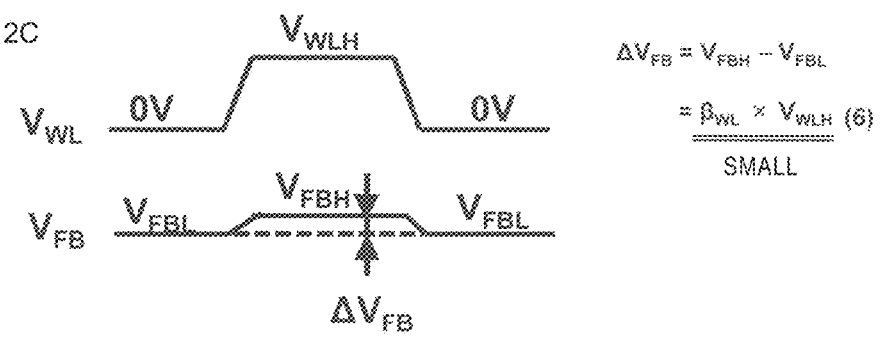

FIGS. 2A to 2C are diagrams for explaining an effect attained in a case where the gate capacitance of the first gate conductor layer 5a connected to the plate line PL is made larger than the gate capacitance of the second gate conductor layer 5b to which the word line WL is connected.

FIG. 2A is a simplified structural diagram of the dynamic flash memory cell according to the first embodiment of the present invention and illustrates only main parts. To the dynamic flash memory cell, the bit line BL, the word line WL, the plate line PL, and the source line SL are connected, and the potential state of the channel region 7 is determined by the voltage states of the lines.

FIG. 2B is a diagram for explaining the capacitance relationships of the respective lines. The capacitance $C_{FB}$ of the channel region 7 is equal to the sum of the capacitance $C_{WL}$ between the gate conductor layer 5b to which the word line WL is connected and the channel region 7, the capacitance $C_{PL}$ between the gate conductor layer 5a to which the plate line PL is connected and the channel region 7, the junction capacitance $C_{SL}$ of the PN junction between the source N$^+$ layer 3a to which the source line SL is connected and the channel region 7, and the junction capacitance $C_{BL}$ of the PN junction between the drain N$^+$ layer 3b to which the bit line BL is connected and the channel region 7, and is expressed as follows.

$$C_{FB}=C_{WL}+C_{PL}+C_{BL}+C_{SL} \quad (1)$$

Therefore, the coupling ratio $\beta_{WL}$ between the word line WL and the channel region 7, the coupling ratio $\beta_{PL}$ between the plate line PL and the channel region 7, the coupling ratio $\beta_{BL}$ between the bit line BL and the channel region 7, and the coupling ratio $\beta_{SL}$ between the source line SL and the channel region 7 are expressed as follows.

$$\beta_{WL}=C_{WL}/(C_{WL}+C_{PL}+C_{BL}+C_{SL}) \quad (2)$$

$$\beta_{PL}=C_{PL}/(C_{WL}+C_{PL}+C_{BL}+C_{SL}) \quad (3)$$

$$\beta_{BL}=C_{BL}/(C_{WL}+C_{PL}+C_{BL}+C_{SL}) \quad (4)$$

$$\beta_{SL}=C_{SL}/(C_{WL}+C_{PL}+C_{BL}+C_{SL}) \quad (5)$$

Here, $C_{PL}>C_{WL}$ holds, and therefore, this results in $\beta_{PL}>\beta_{WL}$.

FIG. 2C is a diagram for explaining a change in the voltage $V_{FB}$ of the channel region 7 when the voltage $V_{WL}$ of the word line WL rises at the time of a read operation or a write operation and subsequently drops. Here, the potential difference $\Delta V_{FB}$ when the voltage $V_{WL}$ of the word line WL rises from 0 V to a high voltage state $V_{WLH}$ and the voltage $V_{FB}$ of the channel region 7 transitions from a low voltage state $V_{FBL}$ to a high voltage state $V_{FBH}$ is expressed as follows.

$$\Delta V_{FB}=V_{FBH}-V_{FBL}=\beta_{WL}\times V_{WLH} \quad (6)$$

The coupling ratio $\beta_{WL}$ between the word line WL and the channel region 7 is small and the coupling ratio $\beta_{PL}$ between the plate line PL and the channel region 7 is large, and therefore, $\Delta V_{FB}$ is small, and the voltage $V_{FB}$ of the channel region 7 negligibly changes even when the voltage $V_{WL}$ of the word line WL changes at the time of a read operation or a write operation.

Figure 3B:
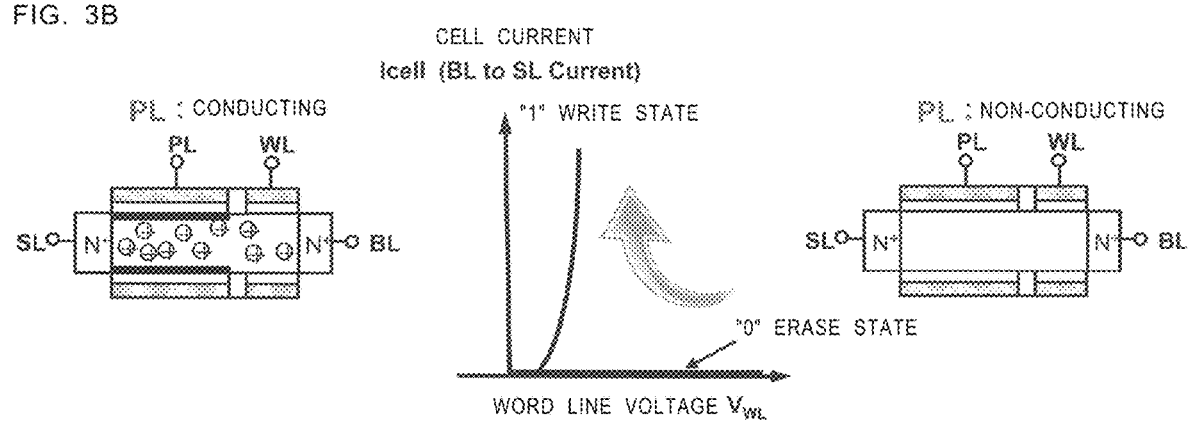
FIG. 3B includes diagrams for explaining the mechanism of the write operation of the memory device including an SGT according to the first embodiment.

FIGS. 3AA to 3AC and FIG. 3B illustrate a memory write operation (which is an example of "memory write operation" in the claims) of the dynamic flash memory cell according to the first embodiment of the present invention. FIG. 3AA illustrates a mechanism of the write operation, and FIG. 3AB illustrates operation waveforms of the bit line BL, the source line SL, the plate line PL, the word line WL, and the channel region 7 that functions as a floating body FB. At time T0, the dynamic flash memory cell is in a "0" erase state, and the voltage of the channel region 7 is equal to $V_{FB}$"0". Vss is applied to the bit line BL, the source line SL, and the word line WL, and $V_{PLL}$ is applied to the plate line PL. Here, for example, Vss is equal to 0 V and $V_{PLL}$ is equal to 2 V. Subsequently, from time T1 to time T2, when the bit line BL rises from Vss to $V_{BLH}$, in a case where, for example, Vss is equal to 0 V, the voltage of the channel region 7 becomes equal to $V_{FB}$"0"+$\beta_{BL}\times V_{BLH}$ due to capacitive coupling between the bit line BL and the channel region 7.

The description of the write operation of the dynamic flash memory cell will be continued with reference to FIGS. 3AA and 3AB. From time T3 to time T4, the word line WL rises from Vss to $V_{WLH}$. Accordingly, when the threshold voltage for "0" erase for a second N-channel MOS transistor region that is a region in which the second gate conductor layer 5b to which the word line WL is connected surrounds the channel region 7b is denoted by Vt$_{WL}$"0", as the voltage of the word line WL rises, in a range from Vss to Vt$_{WL}$"0", the voltage of the channel region 7 becomes equal to $V_{FB}$"0"+$\beta_{BL}\times V_{BLH}$+$\beta_{WL}\times$Vt$_{WL}$"0" due to second capacitive coupling between the word line WL and the channel region 7. When the voltage of the word line WL rises to Vt$_{WL}$"0" or above, an inversion layer 12b in a ring form is formed in the channel region 7 on the inner periphery of the second gate conductor layer 5b and interrupts the second capacitive coupling between the word line WL and the channel region 7.

The description of the write operation of the dynamic flash memory cell will be continued with reference to FIGS. 3AA and 3AB. From time T3 to time T4, for example, a fixed voltage $V_{PLL}$=2 V is applied to the first gate conductor layer 5a to which the plate line PL is connected, and the second gate conductor layer 5b to which the word line WL is connected is increased to, for example, $V_{WLH}$=4 V. As a result, as illustrated in FIG. 3AA, an inversion layer 12a in a ring form is formed in the channel region 7 on the inner periphery of the first gate conductor layer 5a to which the plate line PL is connected, and a pinch-off point 13 is present in the inversion layer 12a. As a result, a first N-channel MOS transistor region formed of the channel region 7a that is surrounded by the first gate conductor layer 5a operates in the saturation region. In contrast, the second N-channel MOS transistor region including the second gate conductor layer 5b to which the word line WL is connected operates in the linear region. As a result, a pinch-off point is not present in the channel region 7 on the inner periphery of the second gate conductor layer 5b to which the word line WL is connected, and the inversion layer 12b is formed on the entire inner periphery of the gate conductor layer 5b. The inversion layer 12b that is formed on the entire inner periphery of the second gate conductor layer 5b to which the word line WL is connected substantially functions as the drain of the first N-channel MOS transistor region. As a result, the electric field becomes maximum in a first boundary region of the channel region 7 between the first N-channel MOS transistor region including the first gate conductor layer 5a and the second N-channel MOS transistor region including the second gate conductor layer 5b that are connected in series, and an impact ionization phenomenon occurs in this region. This region is a source-side region when viewed from the second N-channel MOS transistor region including the second gate conductor layer 5b to which the word line WL is connected, and therefore, this phenomenon is called a source-side impact ionization phenomenon. By this source-side impact ionization phenomenon, electrons flow from the N$^+$ layer 3a to which the source line SL is connected toward the N⁺ layer 3b to which the bit line is connected. The accelerated electrons collide with lattice Si atoms, and electron-positive hole pairs are generated by the kinetic energy. Although some of the generated electrons flow into the first gate conductor layer 5a and into the second gate conductor layer 5b, most of the generated electrons flow into the N⁺ layer 3b to which the bit line BL is connected (not illustrated).

As illustrated in FIG. 3AC, a generated group of positive holes 9 (which is an example of "group of positive holes" in the claims) are majority carriers in the channel region 7, with which the channel region 7 is charged to a positive bias. The N⁺ layer 3a to which the source line SL is connected is at 0 V, and therefore, the channel region 7 is charged up to the built-in voltage Vb (about 0.7 V) of the PN junction between the N⁺ layer 3a to which the source line SL is connected and the channel region 7. When the channel region 7 is charged to a positive bias, the threshold voltages for the first N-channel MOS transistor region and the second N-channel MOS transistor region decrease due to a substrate bias effect.

The description of the write operation of the dynamic flash memory cell will be continued with reference to FIG. 3AB. From time T6 to time T7, the voltage of the word line WL drops from $V_{WLH}$ to Vss. During this period, although the second capacitive coupling is formed between the word line WL and the channel region 7, the inversion layer 12b interrupts the second capacitive coupling until the voltage of the word line WL drops from $V_{WLH}$ to a threshold voltage $Vt_{WL}$"1" for the second N-channel MOS transistor region or below when the voltage of the channel region 7 is equal to Vb. Therefore, the capacitive coupling between the word line WL and the channel region 7 is substantially formed only during a period from when the word line WL drops to $Vt_{WL}$"1" or below to when the word line WL drops to Vss. As a result, the voltage of the channel region 7 becomes equal to Vb−$β_{WL}×Vt_{WL}$"1". Here, $Vt_{WL}$"1" is lower than $Vt_{WL}$"0" described above, and $β_{WL}×Vt_{WL}$"1" is small.

The description of the write operation of the dynamic flash memory cell will be continued with reference to FIG. 3AB. From time T8 to time T9, the bit line BL drops from $V_{BLH}$ to Vss. The bit line BL and the channel region 7 are capacitively coupled with each other, and therefore, the "1" write voltage $V_{FB}$"1" of the channel region 7 becomes as follows at the end.

$$V_{FB}\text{"1"}=Vb-\beta_{WL}\times Vt_{WL}\text{"1"}-\beta_{BL}\times V_{BLH} \quad (7)$$

Here, the coupling ratio $β_{BL}$ between the bit line BL and the channel region 7 is also small. Accordingly, as illustrated in FIG. 3B, the threshold voltage for the second N-channel MOS transistor region of the second channel region 7b to which the word line WL is connected decreases. The memory write operation in which the voltage $V_{FB}$"1" in the "1" write state of the channel region 7 is assumed to be a first data retention voltage (which is an example of "first data retention voltage" in the claims) is performed to assign logical storage data "1".

At the time of the write operation, electron-positive hole pairs may be generated by an impact ionization phenomenon in a second boundary region between the first impurity layer 3a and the first channel semiconductor layer 7a or in a third boundary region between the second impurity layer 3b and the second channel semiconductor layer 7b instead of the first boundary region, and the channel region 7 may be charged with the generated group of positive holes 9.

A mechanism of a memory erase operation (which is an example of "erase operation" in the claims) will be described with reference to FIG. 4A to FIGS. 4EA-4ED.

Figure 4A:
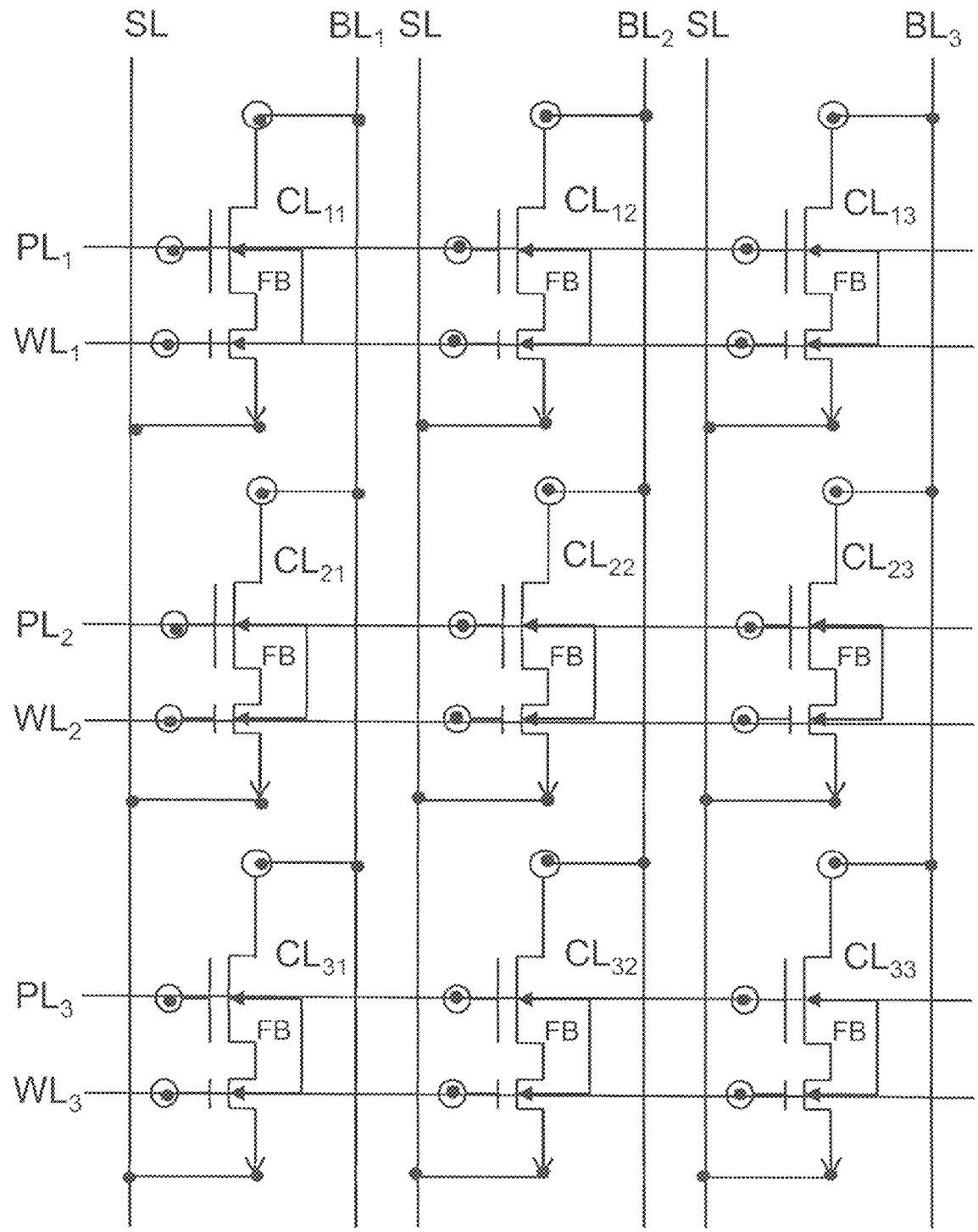
FIG. 4A is a diagram for explaining a mechanism of a page erase operation of the memory device including an SGT according to the first embodiment.

FIG. 4A is a memory block circuit diagram for explaining a page erase operation. Although nine memory cells $CL_{11}$ to $CL_{33}$ in three rows and three columns are illustrated, the actual memory block is larger than this matrix. When memory cells are arranged in a matrix, one of the directions of the arrangement is called a row direction (or in rows) and the direction perpendicular to the one of the directions is called "column direction" (or in columns). To each of the memory cells, the source line SL, a corresponding one of the bit lines $BL_1$ to $BL_3$, a corresponding one of the plate lines $PL_1$ to $PL_3$, and a corresponding one of the word lines $WL_1$ to $WL_3$ are connected. For example, it is assumed that memory cells $CL_{21}$ to $CL_{23}$ to which the plate line $PL_2$ and the word line $WL_2$ are connected are selected in this block and a page erase operation is performed.

A mechanism of the page erase operation will be described with reference to FIGS. 4BA to 4BD and FIG. 4C. Here, the channel region 7 between the N⁺ layers 3a and 3b is electrically isolated from the substrate and functions as a floating body. FIG. 4B(a) is a timing operation waveform diagram of main nodes in the erase operation. In FIG. 4B(a), T0 to T12 indicate times from the start to the end of the erase operation. FIG. 4BB illustrates a state at time T0 before the erase operation, in which the group of positive holes 9 generated by impact ionization in the previous cycle are stored in the channel region 7. From time T1 to time T2, the bit lines $BL_1$ to $BL_3$ and the source line SL rise from Vss to $V_{BLH}$ and $V_{SLH}$ respectively and are in a high-voltage state. Here, Vss is, for example, equal to 0 V. With this operation, during the subsequent period from time T3 to time T4, the plate line $PL_2$ selected in the page erase operation rises from a first voltage $V_{PLL}$ to a second voltage $V_{PLH}$ and is in a high-voltage state, the word line $WL_2$ selected in the page erase operation rises from a third voltage Vss to a fourth voltage $V_{WLH}$ and is in a high-voltage state, and this prevents the inversion layer 12a on the inner periphery of the first gate conductor layer 5a to which the plate line $PL_2$ is connected and the inversion layer 12b on the inner periphery of the second gate conductor layer 5b to which the word line $WL_2$ is connected from being formed in the channel region 7. Therefore, when the threshold voltage for the second N-channel MOS transistor region on the side of the word line $WL_2$ and the threshold voltage for the first N-channel MOS transistor region on the side of the plate line $PL_2$ are denoted by $V_{tWL}$ and $V_{tPL}$ respectively, it is desirable that the voltages $V_{BLH}$ and $V_{SLH}$ satisfy $V_{BLH}>V_{WLH}+V_{tWL}$ and $V_{SLH}>V_{PLH}+V_{tPL}$. For example, in a case where $V_{tWL}$ and $V_{tPL}$ are equal to 0.5 V, $V_{WLH}$ and $V_{PLH}$ need to be set to 3 V, and $V_{BLH}$ and $V_{SLH}$ need to be set to 3.5 V or higher.

The description of the mechanism of the page erase operation illustrated in FIG. 4BA will be continued. As the plate line $PL_2$ and the word line $WL_2$ respectively rise to the second voltage $V_{PLH}$ and the fourth voltage $V_{WLH}$ and are in a high-voltage state during a first period from time T3 to time T4, the voltage of the channel region 7 in a floating state is increased due to first capacitive coupling between the plate line $PL_2$ and the channel region 7 and the second capacitive coupling between the word line $WL_2$ and the channel region 7. The voltage of the channel region 7 rises from $V_{FB}$"1" in the "1" write state to a high voltage. This voltage rise is possible because the voltage of the bit lines $BL_1$ to $BL_3$ and that of the source line SL are high voltages of $V_{BLH}$ and $V_{SLH}$ respectively and the PN junction between the source N⁺ layer 3a and the channel region 7 and the PN junction between the drain N⁺ layer 3b and the channel region 7 are in a reverse bias state accordingly.

The description of the mechanism of the page erase operation illustrated in FIG. 4BA will be continued. During the subsequent period from time T5 to time T6, the voltage of the bit lines BL$_1$ to BL$_3$ and that of the source line SL respectively drop from high voltages of V$_{BLH}$ and V$_{SLH}$ to Vss. As a result, the PN junction between the source N$^+$ layer 3a and the channel region 7 and the PN junction between the drain N$^+$ layer 3b and the channel region 7 are in a forward bias state as illustrated in FIG. 4BC, and a remaining group of positive holes among the group of positive holes 9 in the channel region 7 are discharged to the source N$^+$ layer 3a and to the drain N$^+$ layer 3b. As a result, the voltage V$_{FB}$ of the channel region 7 becomes equal to the built-in voltage Vb of the PN junction formed by the source N$^+$ layer 3a and the P layer, namely, the channel region 7, and the PN junction formed by the drain N$^+$ layer 3b and the P layer, namely, the channel region 7.

The description of the mechanism of the page erase operation illustrated in FIG. 4BA will be continued. Subsequently, from time T7 to time T8, the voltage of the bit lines BL$_1$ to BL$_3$ and that of the source line SL rise from Vss to high voltages of V$_{BLH}$ and V$_{SLH}$ respectively. With this operation, as illustrated in FIG. 4BD, when the plate line PL$_2$ drops from the second voltage V$_{PLH}$ to the first voltage V$_{PLL}$ and the word line WL$_2$ drops from the fourth voltage V$_{WLH}$ to the third voltage Vss, from time T9 to time T10, the voltage V$_{FB}$ of the channel region 7 efficiently changes from Vb to V$_{FB}$"0" due to the first capacitive coupling between the plate line PL$_2$ and the channel region 7 and the second capacitive coupling between the word line WL$_2$ and the channel region 7 without the inversion layer 12a on the side of the plate line PL$_2$ or the inversion layer 12b on the side of the word line WL$_2$ being formed in the channel region 7. The voltage difference ΔV$_{FB}$ of the channel region 7 between the "1" write state and the "0" erase state is expressed by the following expressions.

$$V_{FB}\text{"1"}=Vb-\beta_{WL}\times Vt_{WL}\text{"1"}-\beta_{BL}\times V_{BLH} \quad (7)$$

$$V_{FB}\text{"0"}=Vb-\beta_{WL}\times V_{WLH}-\beta_{PL}\times(V_{PLH}-V_{PLL}) \quad (8)$$

$$\Delta V_{FB}=V_{FB}\text{"1"}-V_{FB}\text{"0"}=\beta_{WL}\times V_{WLH}+\beta_{PL}\times(V_{PLH}-V_{PLL})-\beta_{WL}\times Vt_{WL}\text{"1"}-\beta_{WL}\times V_{BLH} \quad (9)$$

Here, the sum of β$_{WL}$ and β$_{PL}$ is greater than or equal to 0.8, ΔV$_{FB}$ is large, and a sufficient margin is provided.

Figure 4C:
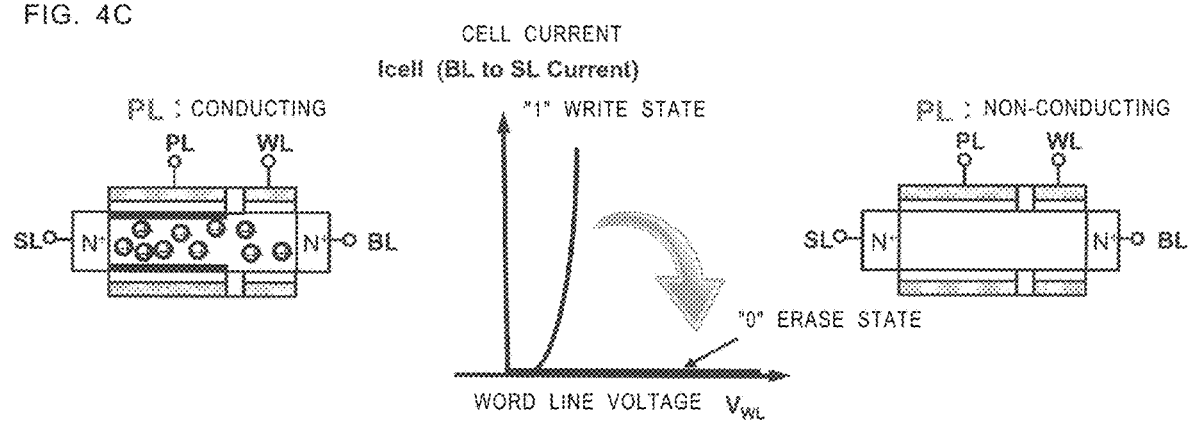
FIG. 4C includes diagrams for explaining the mechanism of the page erase operation of the memory device including an SGT according to the first embodiment.

As a result, as illustrated in FIG. 4C, a large margin is provided between the "1" write state and the "0" erase state. Here, in the "0" erase state, the threshold voltage on the side of the plate line PL$_2$ is high due to a substrate bias effect. Therefore, when the voltage applied to the plate line PL$_2$ is set to, for example, the threshold voltage or lower, the first N-channel MOS transistor region on the side of the plate line PL$_2$ becomes non-conducting and does not allow the memory cell current to flow therethrough. This state is illustrated in the right part of FIG. 4C and indicated as "PL: non-conducting".

The description of the mechanism of the page erase operation illustrated in FIG. 4BA will be continued. During the subsequent period, namely, a fourth period from time T11 to time T12, the voltage of the bit lines BL$_1$ to BL$_3$ drops from V$_{BLH}$ to Vss and that of the source line SL drops from V$_{SLH}$ to Vss, and the erase operation ends. At this time, although the bit lines BL$_1$ to BL$_3$ and the source line SL slightly decrease the voltage of the channel region 7 due to capacitive coupling, this decrease is equal to the increase in the voltage of the channel region 7 by the bit lines BL$_1$ to BL$_3$ and the source line SL due to capacitive coupling from time T7 to time T8, and therefore, the decrease and the increase in the voltage by the bit lines BL$_1$ to BL$_3$ and the source line SL are canceled out, and the voltage of the channel region 7 is not affected consequently. The page erase operation in which the voltage V$_{FB}$"0" in the "0" erase state of the channel region 7 is assumed to be a second data retention voltage (which is an example of "second data retention voltage" in the claims) is performed to assign logical storage data "0". When the voltage applied to the first gate conductor layer 5a connected to the plate line PL is set to a voltage higher than the threshold voltage at the time of logical storage data "1" and lower than the threshold voltage at the time of logical storage data "0" in data reading after the erase operation, a property that a current does not flow even when the voltage of the word line WL is increased can be attained as illustrated in FIG. 4C.

Now, a mechanism of the page erase operation will be described with reference to FIGS. 4DA to 4DD. FIGS. 4DA-4DD is different from FIGS. 4BA-4BD in that the bit lines BL$_1$ to BL$_3$ are kept at Vss or put in a floating state and the word line WL$_2$ is kept at Vss during the page erase operation. Accordingly, from time T1 to time T2, even when the source line SL rises from Vss to V$_{SLH}$, the second N-channel MOS transistor region of the word line WL$_2$ is non-conducting, and the memory cell current does not flow therethrough. Therefore, the group of positive holes 9 caused by an impact ionization phenomenon are not generated. The others are the same as in FIGS. 4BA-4BD, and the source line SL changes between Vss and V$_{SLH}$, and the plate line PL$_2$ changes between V$_{PLL}$ and V$_{PLH}$. As a result, as illustrated in FIG. 4DC, the group of positive holes 9 are discharged to the first impurity layer, namely, the N$^+$ layer 3a, of the source line SL.

Now, a mechanism of the page erase operation will be described with reference to FIG. 4EA to FIG. 4ED. FIGS. 4EA-4ED is different from FIGS. 4BA-4BD in that the source line SL is kept at Vss or put in a floating state and the plate line PL$_2$ is kept at Vss during the page erase operation. Accordingly, from time T1 to time T2, even when the bit lines BL$_1$ to BL$_3$ rise from Vss to V$_{BLH}$, the first N-channel MOS transistor region of the plate line PL$_2$ is non-conducting, and the memory cell current does not flow therethrough. Therefore, the group of positive holes 9 caused by an impact ionization phenomenon are not generated. The others are the same as in FIGS. 4BA-4BD, and the bit lines BL$_1$ to BL$_3$ change between Vss and V$_{BLH}$, and the word line WL$_2$ changes between Vss and V$_{WLH}$. As a result, as illustrated in FIG. 4EC, the group of positive holes 9 are discharged to the second impurity layer, namely, the N$^+$ layer 3b, of the bit lines BL$_1$ to BL$_3$.

FIGS. 5A to 5C are diagrams for explaining a read operation of the dynamic flash memory cell according to the first embodiment of the present invention. As illustrated in FIG. 5A, when the channel region 7 is charged up to the built-in voltage Vb (about 0.7 V), the threshold voltage for the second N-channel MOS transistor region including the second gate conductor layer 5b to which the word line WL is connected decreases due to a substrate bias effect. This state is assigned to logical storage data "1". As illustrated in FIG. 5B, a memory block selected before writing is in an erase state "0" in advance, and the voltage V$_{FB}$ of the channel region 7 is equal to V$_{FB}$"0". With a write operation, a write state "1" is stored at random. As a result, logical storage data of logical "0" and that of logical "1" are created for the word line WL. As illustrated in FIG. 5C, the level difference between the two threshold voltages of the word line WL is used to perform reading by a sense amplifier.

When the voltage applied to the first gate conductor layer 5a connected to the plate line PL is set to a voltage higher than the threshold voltage at the time of logical storage data "1" and lower than the threshold voltage at the time of logical storage data "0" in data reading, a property that a current does not flow even when the voltage of the word line WL is increased can be attained as illustrated in FIG. 5C.

Now, a circuit block diagram and an operation waveform diagram related to a memory read operation will be described with reference to FIG. 6A and FIG. 6B.

Figure 6A:
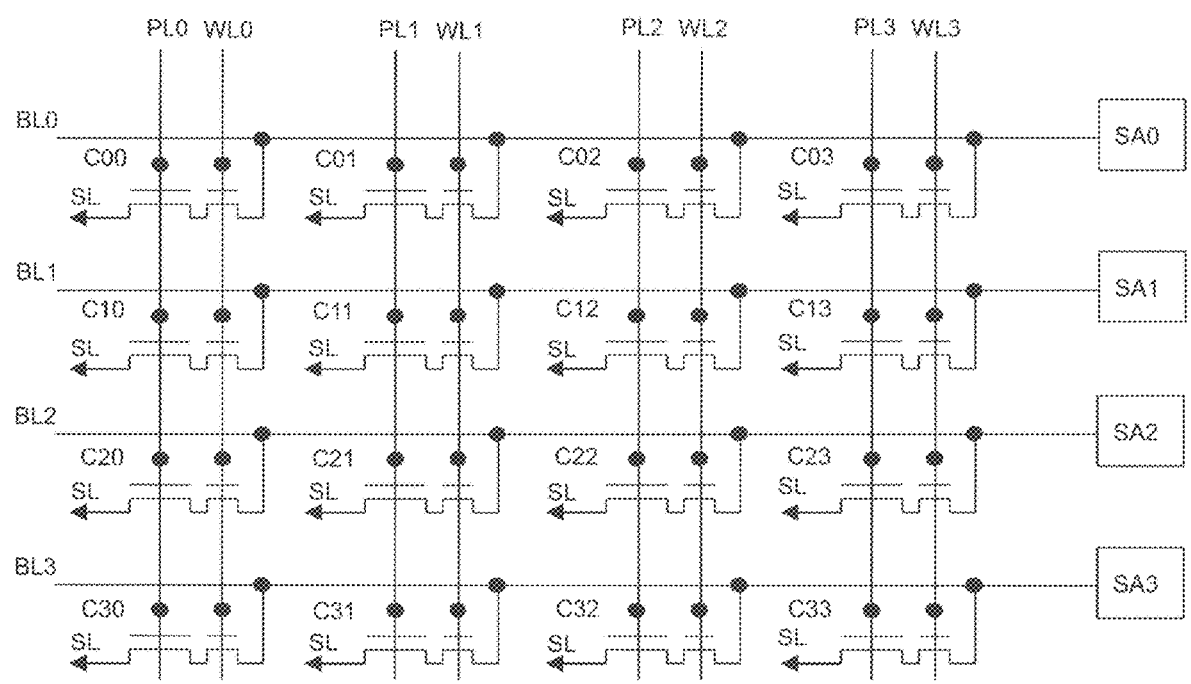
FIG. 6A is a circuit block diagram for explaining a memory read operation of the memory device including an SGT according to the first embodiment.

FIG. 6A illustrates a part of a block (which is an example of "block" in the claims), in which a plurality of memory cells C00 to C33 are arranged in a matrix in four rows and four columns. In the actual memory block, the number of memory cells is larger than that of four rows and four columns. To each of the memory cells, a corresponding one of the word lines WL0 to WL3, a corresponding one of the plate lines PL0 to PL3, and a corresponding one of the bit lines BL0 to BL3 are connected. The bit lines BL0 to BL3 are respectively connected to sense amplifier circuits SA0 to SA3.

Now, a case where, for example, memory cells C01, C11, C21, and C31 illustrated in FIG. 6A perform a memory read operation (which is an example of "memory read operation" in the claims) will be specifically described. An operation waveform diagram is illustrated in FIG. 6B, and the word line WL1 and the plate line PL1 connected to the memory cells C01, C11, C21, and C31 are selected. The word line WL1 rises from a first voltage V1 (which is an example of "first voltage" in the claims) to a high voltage of a second voltage V2 (which is an example of "second voltage" in the claims), from time T1 to time T2. Here, the first voltage may be equal to, for example, the ground voltage Vss=0 V. When the word line WL1 rises from the first voltage to the second voltage, the bit lines BL0 to BL$_3$ are at a low voltage of a third voltage V3 (which is an example of "third voltage" in the claims), and therefore, the inversion layer 12b is formed in the second channel semiconductor layer 7b. As a result, capacitive coupling between the word line WL1 and the channel semiconductor layer 7b is interrupted (shielded), and the group of positive holes 9 stored in the channel semiconductor layer of the memory cell to which "1" is written are prevented from being discharged through either the first impurity layer 3a or the second impurity layer 3b or both the first impurity layer 3a and the second impurity layer 3b. Here, the third voltage may be equal to, for example, the ground voltage Vss=0 V.

Subsequently, the bit lines BL0 to BL$_3$ that are at the third voltage V3 at time T3 in FIG. 6B rises to a fourth voltage V4 (which is an example of "fourth voltage" in the claims) at time T4 in FIG. 6B, and the bit lines BL0 to BL3 are in a floating state at the fourth voltage V4. The word line WL1 rises to the second voltage V2 prior to the bit lines BL0 to BL3, and therefore, pieces of storage data (which correspond to an example of "pieces of storage data" in the claims) in the memory cells C01, C11, C21, and C31 are read to the bit lines BL0 to BL3 in a floating state. The pieces of data read to the bit lines BL0 to BL3 are determined to be logical "1" or logical "0" by the sense amplifier circuits SA0 to SA3. The bit line BL in a floating state to which "0" is read is kept at the fourth voltage V4. The bit line BL in a floating state to which "1" is read discharges due to the memory cell current and drops to the third voltage V3 (at time T5). Subsequently, in a case where the sense amplifier circuits SA0 to SA3 are of a dynamic type including a flip-flop circuit, the potential difference is detected.

In a case where sense amplifier circuits of a static type including a current mirror circuit are used as the sense amplifier circuits SA0 to SA3, for example, a load transistor that is a P-type MOS transistor (not illustrated) is connected to each of the bit lines BL0 to BL3. This load transistor is opposed against the memory cell current, and logical "1" or logical "0" are determined by the current mirror circuit.

Subsequently, the bit lines BL0 to BL3 that are kept at the fourth voltage V4 at time T6 in FIG. 6B drop to the third voltage V3 at time T7 in FIG. 6B and a reset operation (which is an example of "reset operation" in the claims) starts. At this time point, the word line WL1 is at a high voltage of the second voltage V2. As a result, as the bit lines BL0 to BL3 drop, the inversion layer 12b is formed in the second channel semiconductor layer 7b.

The word line WL1 that is at the second voltage V2 at time T8 drops to the first voltage V1 at time T9. The inversion layer 12b is present in the second channel semiconductor layer 7b, capacitive coupling between the word line WL1 and the channel semiconductor layer 7b is interrupted (shielded), and the group of positive holes 9 stored in the channel semiconductor layer of the memory cell to which "1" is written are prevented from being discharged through either the first impurity layer 3a or the second impurity layer 3b or both the first impurity layer 3a and the second impurity layer 3b.

During the memory read operation and during the reset operation, the source line SL may be kept at a fifth voltage V5 (which is an example of "fifth voltage" in the claims). Here, the fifth voltage V5 may be equal to, for example, the ground voltage Vss=0 V. During the memory read operation and during the reset operation, the plate line PL1 that is the first driving control line may be kept at a sixth voltage V6 (which is an example of "sixth voltage" in the claims).

Although a case where the plate line PL1 is decoded and selected similarly to the word line WL1 has been described with reference to FIG. 6A and FIG. 6B, the plate line PL may have a structure common to the block and need not be decoded.

Now, a refresh operation (which is an example of "refresh operation" in the claims) of the present invention will be described with reference to FIGS. 6CA-6CB and FIGS. 6DA-6DB.

Figure 6C:
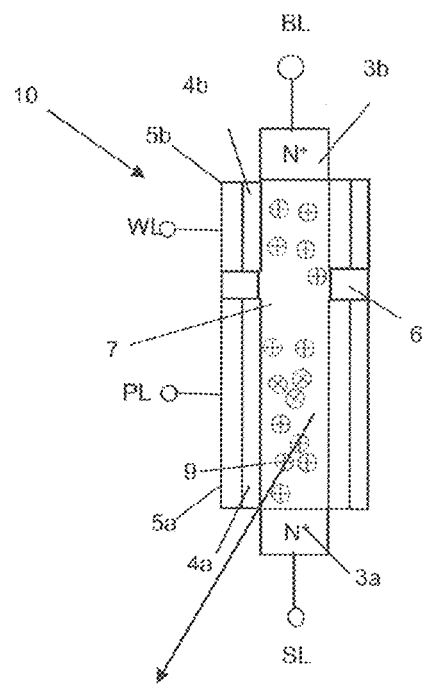
FIGS. 6CA and 6CB include diagrams for explaining a refresh operation of the memory device including an SGT according to the first embodiment.
Figure 6C:
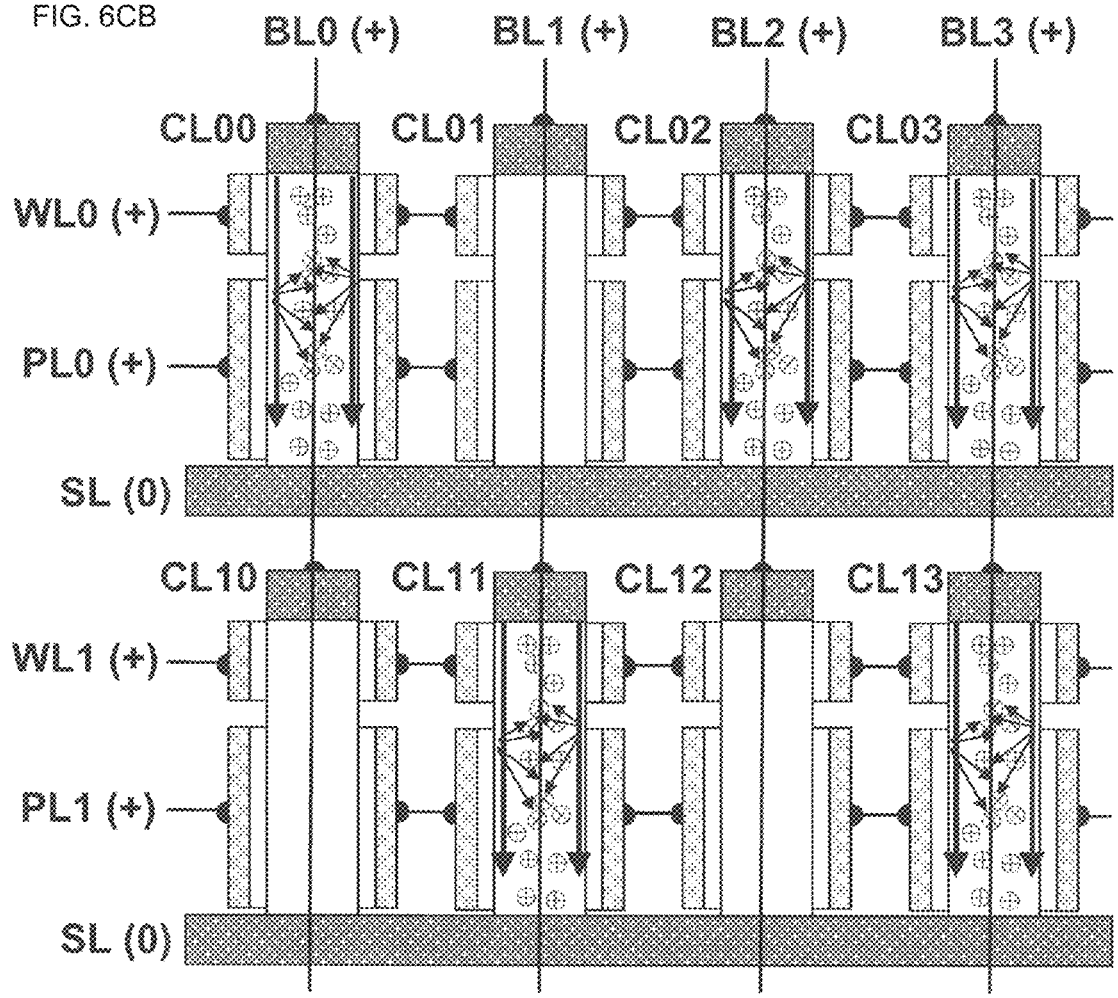
Figure 7A:
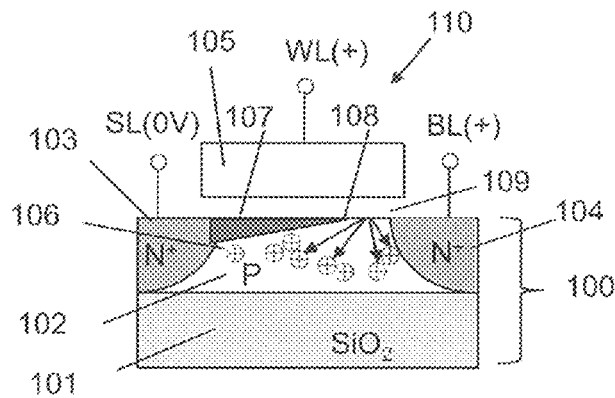
FIGS. 7A, 7B, 7C and 7D include diagrams for explaining a write operation of a DRAM memory cell including no capacitor in the related art.
Figure 7B:
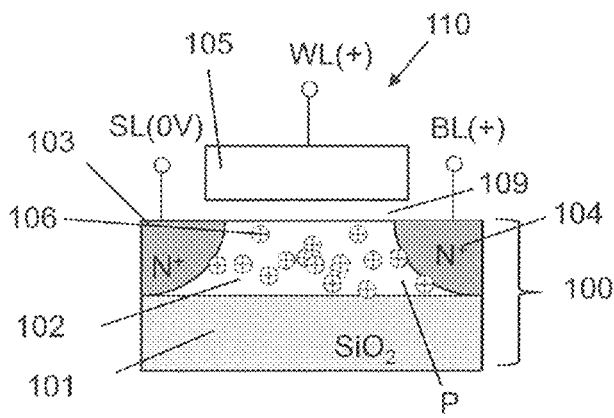
Figure 7C:
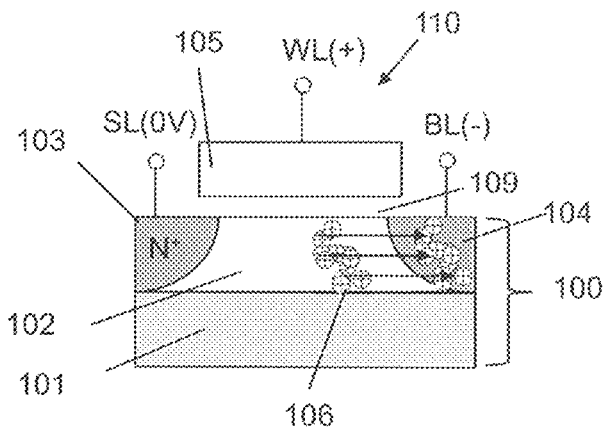
Figure 7D:
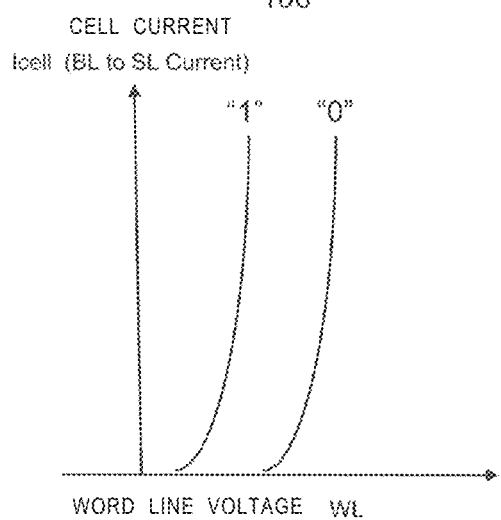
Figure 8A:
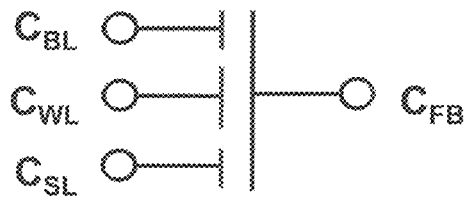
FIGS. 8A and 8B include diagrams for explaining a problem in the operation of the DRAM memory cell including no capacitor in the related art.
Figure 8B:
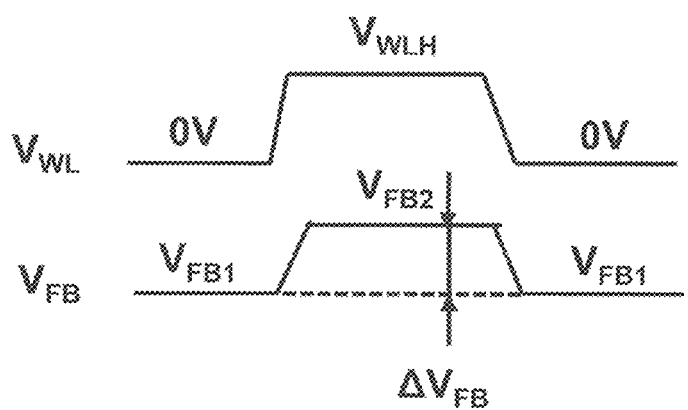
Figure 9A:
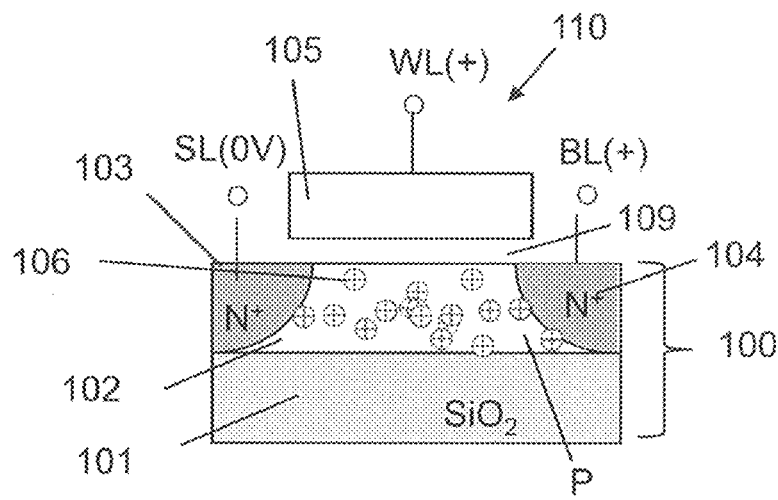
FIGS. 9A, 9B and 9C include diagrams for explaining a read operation of the DRAM memory cell including no capacitor in the related art.
Figure 9B:
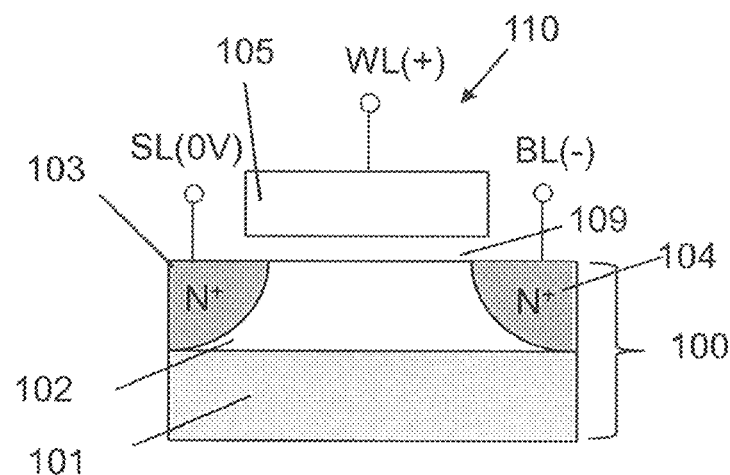
Figure 9C:
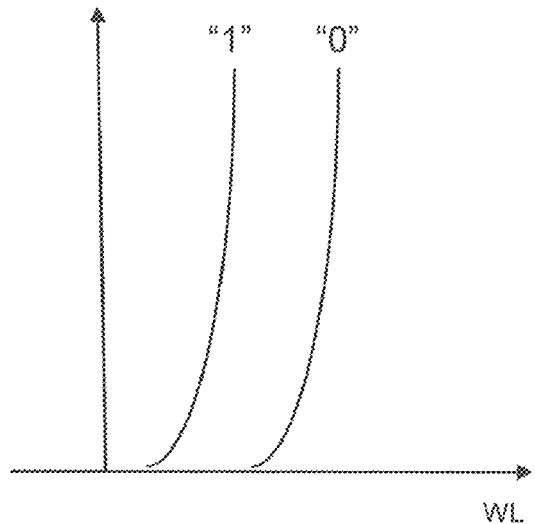

FIG. 6CA illustrates a single dynamic flash memory cell that is constituted by a single semiconductor base material and to which "1" is written. Although the initial voltage of the channel region 7 to which "1" is written is equal to $V_{FB}$"1", the voltage decreases to $V_{FB}$"1"–Vα over time. This is caused by a leak current of the group of positive holes 9 from the channel region 7, and this leak current is, for example, a leak current to the source N$^+$ layer 3a and to the drain N$^+$ layer 3b. FIG. 6CB illustrates eight dynamic flash memory cells CL00 to CL13 that constitute a part of the same block in which a plurality of semiconductor base materials are arranged in a matrix. Here, dynamic flash memory cells CL00, CL02, CL03, CL11, and CL13 are in a "1" write state at a first time (which is an example of "first time" in the claims), and the group of positive holes 9 are excessively retained in the channel region 7. Dynamic flash memory cells CL01, CL10, and CL12 are in a "0" erase state and no excessive group of positive holes 9 are retained in the channel region 7. To perform a refresh operation for the dynamic flash memory cells CL00, CL02, CL03, CL11, and CL13 in the "1" write state, a positive bias is applied to the bit lines BL0 to BL3, to the word lines WL0 and WL1, and to the plate lines PL0 and PL1, and the source line SL is kept at Vss. Here, Vss is equal to, for example, 0 V. Specific examples of the operation waveforms are illustrated in FIG. 6DA, which illustrates changes in the voltages of the bit line BL, the source line SL, the word line WL, the plate line PL, and the channel region 7 that functions as the floating body FB, over time from time T10 to time T14. At time T10 that is a second time (which is an example of "second time" in the claims), the voltage of the channel region 7 of the dynamic flash memory cell to which "1" is written drops to $V_{FB1}=V_{FB}$"1"–Vα. At time T11, the voltage of the word line WL rises from a seventh voltage V7 (which is an example of "seventh voltage" in the claims) to an eighth voltage V8 (which is an example of "eighth voltage" in the claims). As a result, due to capacitive coupling between the word line WL and the P layer, namely, the channel region 7, when the coupling ratio of capacitive coupling between the word line WL and the channel region 7 is denoted by $\beta_{WL}$, the voltage $V_{FB2}$ of the channel region 7 is expressed by expressions (2) and (10) below.

$$\beta_{WL}=C_{WL}/(C_{WL}+C_{PL}+C_{BL}+C_{SL}) \quad (2)$$

$$V_{FB2}=V_{FB1}+\beta_{WL}\times(V8-V7) \quad (10)$$

Here, the seventh voltage V7 may be equal to, for example, the ground voltage Vss=0 V.

Next, at time T12, the bit line BL rises from a ninth voltage V9 (which is an example of "ninth voltage" in the claims) to a high voltage of a tenth voltage V10 (which is an example of "tenth voltage" in the claims). The ninth voltage V9 may be equal to, for example, the ground voltage Vss=0 V. The tenth voltage V10 is a voltage applied to the bit line BL in the refresh operation for the block to which "1" is written. As a result, in the dynamic flash memory cells CL00, CL02, CL03, CL11, and CL13 that are in the "1" write state, the first N-channel MOS transistor region that is a region in which the first gate conductor layer 5a to which the plate line PL0 or PL1 is connected surrounds the channel region 7 operates in the saturation region, and the second N-channel MOS transistor region that is a region in which the second gate conductor layer 5b to which the word line WL0 or WL1 is connected surrounds the channel layer 7 operates in the linear region. Accordingly, a current flows from the drain N+ layer 3b to the source N+ layer 3a, and the group of positive holes 9 are generated by an impact ionization phenomenon and fills the channel region 7. As a result, the voltage of the channel region 7 becomes equal to the built-in voltage Vb (about 0.7 V). In contrast, in the dynamic flash memory cells CL01, CL10, and CL12 that are in the "0" erase state, the threshold voltage $Vt_{PL}$"0" for the "0" erase state for the first N-channel MOS transistor region that is a region in which the first gate conductor layer 5a to which the plate line PL0 or PL1 is connected surrounds the channel layer 7 and the threshold voltage $Vt_{WL}$"0" for the "0" erase state for the second N-channel MOS transistor region that is a region in which the second gate conductor layer 5b to which the word line WL0 or WL1 is connected surrounds the channel layer 7 are high, and therefore, a current does not flow from the drain N+ layer 3b to the source N+ layer 3a at time T12, and an impact ionization phenomenon does not occur.

Subsequently, at time T13, the bit line BL drops from the tenth voltage V10 to the ninth voltage V9. Accordingly, the inversion layer 12b is generated in the channel layer 7 surrounded by the second gate conductor layer 5b to which the word line WL is connected. This inversion layer interrupts the second capacitive coupling between the second gate conductor layer 5b and the channel layer 7. When the threshold voltage for the "1" write state for the second N-channel MOS transistor region that is a region in which the second gate conductor layer 5b surrounds the channel layer 7 is denoted by $Vt_{WL}$"1", the second capacitive coupling between the second gate conductor layer 5b and the channel layer 7 works when the voltage of the word line WL drops to $Vt_{WL}$"1" or below, and the voltage of the channel region 7 becomes equal to Vb1 expressed by expression (11) below.

$$Vb1=Vb-\beta_{BL}\times(v10-V9) \quad (11)$$

Subsequently, at time T14, the word line WL drops from the eighth voltage V8 to the seventh voltage V7, and the refresh operation for the block to which "1" is written ends. The voltage $V_{FB}$"1" of the channel region 7 becomes equal to Vb2 at the end expressed by expression (12).

$$V_{FB}\text{"1"}=Vb2=Vb1-\beta_{WL}\times(V8-V7)=Vb-\beta_{BL}\times(V10-V9)-\beta_{WL}\times(V8-V7) \quad (12)$$

Therefore, as illustrated in FIG. 6DB, in the graph showing the relationship between the word line voltage $V_{WL}$ and the cell current Icell, the threshold voltage $Vt_{WL}$ for the second N-channel MOS transistor region that is a region in which the second gate conductor layer 5b surrounds the channel layer 7 decreases from the dashed line representing the "1" write state before refreshing to the solid line representing the "1" write state.

Regardless of whether the horizontal cross-sectional shape of the Si pillar 2 illustrated in FIG. 1 is a round shape, an elliptic shape, or a rectangular shape, the operations of the dynamic flash memory described in this embodiment can be performed. Further, a dynamic flash memory cell having a round shape, a dynamic flash memory cell having an elliptic shape, and a dynamic flash memory cell having a rectangular shape may coexist on the same chip.

With reference to FIG. 1, the dynamic flash memory element including an example SGT in which the first gate insulating layer 4a and the second gate insulating layer 4b that surround the entire side surface of the Si pillar 2 standing on the substrate in the vertical direction are provided and which includes the first gate conductor layer 5a and the second gate conductor layer 5b that entirely surround the first gate insulating layer 4a and the second gate insulating layer 4b has been described. As illustrated in the description of this embodiment, the dynamic flash memory element needs to have a structure that satisfies the condition that the group of positive holes 9 generated by an impact ionization phenomenon are retained in the channel region 7. For this, the channel region 7 needs to have a floating body structure isolated from the substrate. Accordingly, even when the semiconductor base material of the channel region is formed horizontally along the substrate by using, for example, GAA (Gate All Around, see, for example, NPL 11) technology, which is one type of SGT, or nanosheet technology (see, for example, NPL 12), the above-described operations of the dynamic flash memory can be performed. Alternatively, the dynamic flash memory element may have a device structure using SOI (Silicon On Insulator) (see, for example, NPL 7 to NPL 10). In this device structure, the bottom portion of the channel region is in contact with an insulating layer of the SOI substrate, and the other portion of the channel region is surrounded by a gate insulating layer and an element isolation insulating layer. Also with such a structure, the channel region has a floating body structure. Accordingly, the dynamic flash memory element provided in this embodiment needs to satisfy the condition that the channel region has a floating body structure. Even with a structure in which a Fin transistor (see, for example, NPL 13) is formed on an SOI substrate, when the channel region has a floating body structure, the dynamic flash operations can be performed.

To write "1", electron-positive hole pairs may be generated by using a gate-induced drain leakage (GIDL) current (see for example, NPL 14), and the channel region 7 may be filled with the generated group of positive holes.

Expressions (1) to (12) provided in the specification and in the drawings are expressions used to qualitatively explain the phenomena, and are not intended to limit the phenomena.

Although the reset voltages of the word line WL, the bit line BL, and the source line SL are specified as Vss in the explanations of FIGS. 3AA-3AC and FIG. 3B, the reset voltages may be set to different voltages.

Although FIG. 4A, FIGS. 4DA-4DD, and FIGS. 4EA-4ED illustrate example conditions of the page erase operation, the voltages applied to the source line SL, the plate line PL, the bit line BL, and the word line WL may be changed as long as a state in which the group of positive holes 9 in the channel region 7 are discharged through either the $N^+$ layer 3a or the $N^+$ layer 3b or both the $N^+$ layer 3a and the $N^+$ layer 3b can be attained. Further, in the page erase operation, a voltage may be applied to the source line SL of a selected page, and the bit line BL may be put in a floating state. In the page erase operation, a voltage may be applied to the bit line BL of a selected page, and the source line SL may be put in a floating state.

In FIG. 1, in the vertical direction, in a part of the channel region 7 surrounded by the insulating layer 6 that is the first insulating layer, the potential distribution of the first channel region 7a and that of the second channel region 7b are connected and formed. Accordingly, the first channel region 7a and the second channel region 7b that constitute the channel region 7 are connected in the vertical direction in the region surrounded by the insulating layer 6 that is the first insulating layer.

Note that in FIG. 1, it is desirable to make the length of the first gate conductor layer 5a, in the vertical direction, to which the plate line PL is connected further longer than the length of the second gate conductor layer 5b, in the vertical direction, to which the word line WL is connected to attain $C_{PL}>C_{WL}$. However, when only the plate line PL is added, the coupling ratio ($C_{WL}/(C_{PL}+C_{WL}+C_{BL}+C_{SL})$), of capacitive coupling, of the word line WL to the channel region 7 decreases. As a result, the potential change $\Delta V_{FB}$ of the floating body, namely, the channel region 7, decreases.

As the voltage $V_{PLL}$ of the plate line PL, a fixed voltage of, for example, 2 V may be applied in operation modes other than a mode in which selective erasing is performed in a block erase operation.

Note that in the specification and the claims, the meaning of "cover" in a case of "for example, a gate insulating layer or a gate conductor layer covers, for example, a channel" also includes a case of surrounding entirely as in an SGT or GAA, a case of surrounding except a portion as in a Fin transistor, and a case of overlapping a flat object as in a planar transistor.

Although the first gate conductor layer 5a entirely surrounds the first gate insulating layer 4a in FIG. 1, a structure may be employed in which the first gate conductor layer 5a partially surrounds the first gate insulating layer 4a in plan view. In this case, the outer side of the first gate insulating layer not covered by the first gate conductor layer 5a may be covered by an insulating layer or a third gate conductor layer electrically isolated from the first gate conductor layer. In a case where the third gate conductor layer is provided, a constant voltage or a pulse voltage can be applied to the third gate conductor layer to perform the operations of the dynamic flash memory. With the structure as described above in which the first gate conductor layer 5a partially surrounds the first gate insulating layer 4a in plan view, a group of a larger number of positive holes can be stored in the first channel region 7a.

Although the channel region 7a is entirely surrounded by the first gate conductor layer 5a in FIG. 1, the first gate conductor layer 5a may be divided into two or more gate conductor layers, and each of the gate conductor layers may function as a conductive electrode of the plate line and surround the channel region 7a. The two or more gate conductor layers obtained as a result of division may be operated synchronously or asynchronously at the same driving voltage or different driving voltages. Similarly, the second gate conductor layer 5b may be divided into two or more gate conductor layers, and the gate conductor layers may each function as a conductive electrode of the word line and may be operated synchronously or asynchronously at the same driving voltage or different driving voltages. Also in this case, the operations of the dynamic flash memory can be performed. In a case where the first gate conductor layer 5a is divided into two or more gate conductor layers, at least one of the first gate conductor layers obtained as a result of division assumes the roles of the first gate conductor layer 5a described above. In a case where the second gate conductor layer 5b is divided into two or more gate conductor layers, at least one of the second gate conductor layers obtained as a result of division assumes the roles of the second gate conductor layer 5b described above.

In FIG. 1, the first gate conductor layer 5a may be connected to the word line WL, and the second gate conductor layer 5b may be connected to the plate line PL. Also in this case, the operations of the dynamic flash memory described above can be performed.

The above-described conditions of voltages applied to the bit line BL, the source line SL, the word line WL, and the plate line PL and the voltage of the floating body are examples for performing basic operations including the erase operation, the write operation, and the read operation, and other voltage conditions may be employed as long as basic operations of the present invention can be performed.

This embodiment has the following features.

(Feature 1)

The dynamic flash memory cell of this embodiment is constituted by the $N^+$ layers 3a and 3b that function as the source and the drain, the channel region 7, the first gate insulating layer 4a, the second gate insulating layer 4b, the first gate conductor layer 5a, and the second gate conductor layer 5b, which are formed in a pillar form as a whole. The $N^+$ layer 3a that functions as the source is connected to the source line SL, the $N^+$ layer 3b that functions as the drain is connected to the bit line BL, the first gate conductor layer 5a is connected to the plate line PL, and the second gate conductor layer 5b is connected to the word line WL. A structure is employed in which the gate capacitance of the first gate conductor layer 5a to which the plate line PL is connected is larger than the gate capacitance of the second gate conductor layer 5b to which the word line WL is connected, which is a feature. In the dynamic flash memory cell, the first gate conductor layer and the second gate conductor layer are stacked in the vertical direction. Accordingly, even when the structure is employed in which the gate capacitance of the first gate conductor layer 5a to which the plate line PL is connected is larger than the gate capacitance of the second gate conductor layer 5b to which the word line WL is connected, the memory cell area does not increase in plan view. Accordingly, a high-performance and highly integrated dynamic flash memory cell can be implemented.
(Feature 2)

In the memory read operation and in the refresh operation of the dynamic flash memory cell according to the first embodiment of the present invention, the word line WL rises prior to the bit line BL. As a result, the inversion layer 12b is formed in the channel semiconductor layer 7 of the memory cell to which "1" is written, to interrupt (shield) capacitive coupling between the word line WL and the channel semiconductor layer 7. Therefore, some of the group of positive holes 9 stored in the channel semiconductor layer 7 are not discharged, erroneous reading can be prevented even when a read operation is repeated, and a highly reliable memory device can be provided.
(Feature 3)

In the reset operation for the memory read operation and the refresh operation, which is subsequent to the operations described in (Feature 2) of the dynamic flash memory cell according to the first embodiment of the present invention, the bit line BL drops prior to the word line WL. As a result, capacitive coupling between the word line WL and the channel semiconductor layer 7 is interrupted (shielded) by the inversion layer 12b formed in the channel semiconductor layer 7. Therefore, some of the group of positive holes 9 stored in the channel semiconductor layer 7 are not discharged, "1" write data is not lost even when a read operation is repeated, and a highly reliable memory device can be provided.
(Feature 4)

In terms of the roles of the first gate conductor layer 5a to which the plate line PL is connected in the dynamic flash memory cell according to the first embodiment of the present invention, in the write operation and in the read operation performed by the dynamic flash memory cell, the voltage of the word line WL changes. At this time, the plate line PL assumes the role of decreasing the capacitive coupling ratio between the word line WL and the channel region 7. As a result, an effect on changes in the voltage of the channel region 7 when the voltage of the word line WL changes can be substantially suppressed. Accordingly, the difference between the threshold voltages for the SGT transistor of the word line WL indicating logical "0" and logical "1" can be increased. This leads to an increased operation margin of the dynamic flash memory cell.
(Feature 5)

In FIG. 6A, the plate line common to the memory cells C00 to C33 may be used. As a result, the processes and circuits can be more simplified, and a higher speed can be attained.

Other Embodiments

Although the Si pillar is formed in the present invention, the Si pillar may be a semiconductor pillar made of a semiconductor material other than Si. This is similarly applicable to other embodiments according to the present invention.

In vertical NAND-type flash memory circuits, memory cells that are stacked in a plurality of stages in the vertical direction and each of which is constituted by a semiconductor pillar, which functions as the channel, and a tunnel oxide layer, a charge storage layer, an interlayer insulating layer, and a control conductor layer that surround the semiconductor pillar are formed. At the semiconductor pillars on both ends of these memory cells, a source line impurity layer corresponding to the source and a bit line impurity layer corresponding to the drain are disposed respectively. In addition, for one memory cell, when one of the memory cells on both sides of the one memory cell functions as the source, the other functions as the drain. Accordingly, the vertical NAND-type flash memory circuit is one type of SGT circuit. Therefore, the present invention is also applicable to a circuit in which a NAND-type flash memory circuit coexists.

To write "1", electron-positive hole pairs may be generated by an impact ionization phenomenon using a gate-induced drain leakage (GIDL) current described in NPL 10 and NPL 14, and the floating body FB may be filled with the generated group of positive holes. This is similarly applicable to other embodiments according to the present invention.

Even with a structure in which the conductivity type that is the polarity of each of the $N^+$ layers 3a and 3b and the P-layer Si pillar 2 in FIG. 1 is reversed, the operations of the dynamic flash memory can be performed. In this case, in the Si pillar 2 that is of N-type, the majority carriers are electrons. Therefore, a group of electrons generated by impact ionization are stored in the channel region 7, and a "1" state is set.

Various embodiments and modifications can be made to the present invention without departing from the spirit and scope of the present invention in a broad sense. The above-described embodiments are intended to explain examples of the present invention and are not intended to limit the scope of the present invention. Any of the above-described embodiments and modifications can be combined. Further, the above-described embodiments from which some of the constituent requirements are removed as needed are also within the scope of the technical spirit of the present invention.

INDUSTRIAL APPLICABILITY

With the memory device including a semiconductor element according to the present invention, a high-density and high-performance dynamic flash memory that is a memory device including an SGT can be obtained.

The invention claimed is:
1. A semiconductor element memory device comprising
 a block that comprises a plurality of memory cells arranged in a matrix,
 each of the memory cells comprising:
 a semiconductor base material that stands on a substrate in a vertical direction or that extends in a horizontal direction along the substrate;
 a first impurity layer and a second impurity layer that are disposed at respective ends of the semiconductor base material;
 a first gate insulating layer that partially or entirely surrounds a side surface of the semiconductor base material between the first impurity layer and the second impurity layer and that is in contact with or in close vicinity to the first impurity layer;
 a second gate insulating layer that partially or entirely surrounds the side surface of the semiconductor base material, that is connected to the first gate insulating layer, and that is in contact with or in close vicinity to the second impurity layer;
 a first gate conductor layer that partially or entirely covers the first gate insulating layer;
 a second gate conductor layer that covers the second gate insulating layer; and a channel semiconductor layer that is a part of the semiconductor base material and that is covered by the first gate insulating layer and the second gate insulating layer, wherein in each of the memory cells, voltages applied to the first gate conductor layer, the second gate conductor layer, the first impurity layer, and the second impurity layer are controlled to perform a write operation and an erase operation, the first impurity layer of each of the memory cells is connected to a source line, the second impurity layer of each of the memory cells is connected to a bit line, one of the first gate conductor layer or the second gate conductor layer of each of the memory cells is connected to a word line, and the other of the first gate conductor layer or the second gate conductor layer of each of the memory cells is connected to a first driving control line, and a voltage of the word line changes from a first voltage to a second voltage that is higher than the first voltage, and a voltage of the bit lines subsequently change from a third voltage to a fourth voltage that is higher than the third voltage to perform a memory read operation of reading to the bit lines, pieces of storage data in a plurality of memory cells selected by the word line.

2. The semiconductor element memory device according to claim 1, wherein in a reset operation subsequent to the memory read operation, the voltage of the bit lines changes from the fourth voltage to the third voltage, and the voltage of the word line subsequently changes from the second voltage to the first voltage.

3. The semiconductor element memory device according to claim 1, wherein the source line is kept at a fifth voltage during the memory read operation and during a reset operation.

4. The semiconductor element memory device according to claim 3, wherein the first driving control line is kept at a sixth voltage during the memory read operation and during the reset operation.

5. The semiconductor element memory device according to claim 4, wherein the sixth voltage is higher than the fifth voltage.

6. The semiconductor element memory device according to claim 1, wherein a voltage of the channel semiconductor layer is equal to a first data retention voltage at a first time, the voltage of the word line changes from a seventh voltage to an eighth voltage that is higher than the first voltage at a second time after an elapse of time from the first time, and the voltage of the bit line subsequently changes from a ninth voltage to a tenth voltage that is higher than the third voltage to perform a refresh operation for the semiconductor base material in which the voltage of the channel semiconductor layer has been equal to the first data retention voltage, and the voltage of the channel semiconductor layer is restored to a voltage close to the first data retention voltage.

7. The semiconductor element memory device according to claim 1, wherein a first gate capacitance between the first gate conductor layer and the channel semiconductor layer is made larger than a second gate capacitance between the second gate conductor layer and the channel semiconductor layer.

8. The semiconductor element memory device according to claim 1, wherein the first gate conductor layer is isolated into two conductor layers around the first gate insulating layer in plan view.

9. The semiconductor element memory device according to claim 1, wherein in the write operation, a group of positive holes generated by an impact ionization phenomenon are retained inside the channel semiconductor layer, and a voltage of the channel semiconductor layer is made equal to a first data retention voltage that is higher than the voltage of either the first impurity layer or the second impurity layer or that is higher than the voltages of both the first impurity layer and the second impurity layer, and in the erase operation, the voltages applied to the first impurity layer, the second impurity layer, the first gate conductor layer, and the second gate conductor layer are controlled to discharge the group of positive holes through either the first impurity layer or the second impurity layer or both the first impurity layer and the second impurity layer, and the voltage of the channel semiconductor layer is made equal to a second data retention voltage that is lower than the first data retention voltage.

* * * * *